(12) United States Patent
Jiang et al.

(10) Patent No.: US 11,276,338 B2
(45) Date of Patent: Mar. 15, 2022

(54) IMAGING DEVICE, DISPLAY APPARATUS, AND IMAGING APPARATUS

(71) Applicant: HUAWEI TECHNOLOGIES CO., LTD., Guangdong (CN)

(72) Inventors: Houqiang Jiang, Shenzhen (CN); Shihong Ouyang, Dongguan (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 0 days.

(21) Appl. No.: 17/036,929

(22) Filed: Sep. 29, 2020

(65) Prior Publication Data

US 2021/0027677 A1 Jan. 28, 2021

Related U.S. Application Data

(63) Continuation of application No. PCT/CN2018/090678, filed on Jun. 11, 2018.

(30) Foreign Application Priority Data

Mar. 30, 2018 (CN) .......................... 201810286730.0

(51) Int. Cl.
*G09G 3/36* (2006.01)
*G09G 3/00* (2006.01)
(Continued)

(52) U.S. Cl.
CPC ........... *G09G 3/003* (2013.01); *G02B 27/283* (2013.01); *G02B 30/25* (2020.01);
(Continued)

(58) Field of Classification Search
CPC ................. G02F 1/13; G02F 1/133531; G02F 1/133528; G02F 1/133439; G02B 27/283;
(Continued)

(56) References Cited

U.S. PATENT DOCUMENTS

2005/0007517 A1* 1/2005 Anandan ........... G02F 1/133603
349/69
2009/0316240 A1* 12/2009 Hara .................. G11B 7/00781
359/33
(Continued)

FOREIGN PATENT DOCUMENTS

CN  101779168 A  7/2010
CN  101881860 A  11/2010
(Continued)

OTHER PUBLICATIONS

Zichen Zhang et al. Fundamentals of phase-only liquid crystal on silicon(LCOS) devices, Light: Science and Applications 3 (2014), published online Oct. 24, 2014, pp. 1-10.

*Primary Examiner* — Pegeman Karimi
(74) *Attorney, Agent, or Firm* — Womble Bond Dickinson (US) LLP

(57) ABSTRACT

An imaging device is descried herein. The imaging device includes a first imaging structure and a second imaging structure that are respectively and sequentially stacked from bottom to top. The first imaging structure performs amplitude modulation on a light signal based on a first drive signal, and outputs amplitude-modulated light carrying pixel information of a first image and pixel information of a second image, and the first drive signal is determined based on light intensity of the first image and light intensity of the second image. The second imaging structure performs phase modulation on the amplitude-modulated light based on a second drive signal, where phase-modulated light is decomposed into light having two polarization components, which are used when forming the first image and the second image, and the second drive signal is determined based on the light intensity of the first image and the light intensity of the second image.

20 Claims, 10 Drawing Sheets

(51) Int. Cl.
   *G02B 30/25*  (2020.01)
   *G02B 27/28*  (2006.01)
   *G02F 1/1335*  (2006.01)
   *G02F 1/1343*  (2006.01)
   *G09G 3/3208*  (2016.01)
   *H01L 27/32*  (2006.01)
   *H01L 51/52*  (2006.01)
   *G09G 3/34*  (2006.01)

(52) U.S. Cl.
   CPC .... *G02F 1/13439* (2013.01); *G02F 1/133528* (2013.01); *G09G 3/3208* (2013.01); *G09G 3/36* (2013.01); *H01L 27/3232* (2013.01); *H01L 51/5281* (2013.01); *G02F 1/133531* (2021.01); *G09G 3/3413* (2013.01); *G09G 2300/023* (2013.01)

(58) Field of Classification Search
   CPC . G02B 30/25; G09G 3/36; G09G 3/34; G09G 3/32; G09G 2300/023; G09G 3/003; H01L 27/3232; H01L 51/5281
   See application file for complete search history.

(56) References Cited

U.S. PATENT DOCUMENTS

| | | |
|---|---|---|
| 2010/0045640 A1 | 2/2010 | Park et al. |
| 2010/0060810 A1 | 3/2010 | Chang |
| 2013/0321888 A1 | 12/2013 | Sung et al. |
| 2015/0323817 A1* | 11/2015 | Kim .................. G02F 1/157 |
| | | 349/96 |
| 2016/0054576 A1* | 2/2016 | Inoue .................. G02B 5/3016 |
| | | 349/194 |
| 2016/0327906 A1* | 11/2016 | Futterer .................. G03H 1/02 |
| 2018/0203285 A1* | 7/2018 | Safrani ............. G02F 1/133502 |

FOREIGN PATENT DOCUMENTS

| | | |
|---|---|---|
| CN | 102033413 A | 4/2011 |
| CN | 102483605 A | 5/2012 |
| CN | 102809918 A | 12/2012 |
| CN | 102854630 A | 1/2013 |
| CN | 203275779 U | 11/2013 |
| CN | 205263459 U | 5/2016 |
| KR | 20150078397 A | 7/2015 |
| TW | I567363 B | 1/2017 |
| WO | 2011053279 A1 | 5/2011 |

* cited by examiner

IMAGING DEVICE, DISPLAY APPARATUS, AND IMAGING APPARATUS

CROSS-REFERENCE TO RELATED APPLICATIONS

This application is a continuation of International Application No. PCT/CN2018/090678, filed on Jun. 11, 2018, which claims priority to Chinese Patent Application No. 201810286730.0, filed on Mar. 30, 2018. The disclosures of the aforementioned applications are hereby incorporated by reference in their entireties.

TECHNICAL FIELD

This application relates to the field of projection imaging technologies, and more specifically, to an imaging device, a display apparatus, and an imaging apparatus.

BACKGROUND

To achieve a 3D effect, a binocular imaging system is generally used, so that different pictures can be seen from the left eye and the right eye. An image source in the binocular imaging system may use a liquid crystal on silicon (LCOS) display system. There are two types of LCOS light modulators in an existing LCOS display system: an LCOS amplitude modulator and an LCOS phase modulator. Each pixel of the LCOS amplitude modulator controls only intensity information of the pixel, and each pixel of the LCOS phase modulator controls only phase information of the pixel. Two independent LCOS amplitude modulators need to be used in the binocular imaging system, to ensure that different pictures are seen from the left eye and the right eye. Each of the two LCOS amplitude modulators needs to have a complete optical path to implement imaging. Consequently, the binocular imaging system has a relatively large quantity of device components, a relatively large size, and a relatively heavy weight, and is not easy to move.

SUMMARY

This application provides an imaging device, a display apparatus, and an imaging apparatus, to resolve problems that an existing binocular imaging system has a relatively large quantity of device components, a relatively large size, and a relatively heavy weight, and is not easy to move.

According to a first aspect, an imaging device is provided, including a first imaging structure and a second imaging structure that are sequentially stacked from bottom to top, where the first imaging structure is configured to: perform amplitude modulation on a light signal based on a first drive signal, and output amplitude-modulated light, where the amplitude-modulated light carries pixel information of a first image and pixel information of a second image, and the first drive signal is determined based on light intensity of the first image and light intensity of the second image; and the second imaging structure is configured to perform phase modulation on the amplitude-modulated light based on a second drive signal, so that phase-modulated light can be decomposed into light having two polarization components, where the light having the two polarization components is respectively used to form the first image and the second image, and the second drive signal is determined based on the light intensity of the first image and the light intensity of the second image.

In this embodiment of this application, the first imaging structure of the imaging device performs the amplitude modulation on the light signal based on the first drive signal, and the second imaging structure of the imaging device performs the phase modulation on the amplitude-modulated light based on the second drive signal. Because both the first drive signal and the second drive signal are determined based on the light intensity of the first image and the light intensity of the second image, the light on which the amplitude modulation and the phase modulation are performed by the imaging device can be decomposed into the light having the two polarization components, and the light having the two polarization components is respectively used to form the first image and the second image. In this way, the imaging device can implement both the amplitude adjustment and the phase adjustment, load pixel information of two pictures onto emergent light corresponding to a same pixel, and simultaneously output two independent images without a need to use two liquid crystal devices to perform amplitude modulation respectively on the two pictures. The emergent light of the imaging device may share a subsequent imaging optical path. This avoids a disadvantageous case experienced by prior approaches in which imaging optical paths need to be respectively configured for two amplitude modulation liquid crystal devices, decreases a quantity of components in the device (for example, one polarization beam splitter is decreased), reduces a size and a weight of the device, and facilitates mobility of the device.

With reference to the first aspect, in some embodiments of the first aspect, the first imaging structure is a first liquid crystal structure, and the first liquid crystal structure includes a first pixel electrode, a first orientation layer, a first liquid crystal layer, a second orientation layer, first conductive glass, and a first polarizer that are sequentially stacked from bottom to top;

the second imaging structure is a second liquid crystal structure, and the second liquid crystal structure includes a second pixel electrode, a third orientation layer, a second liquid crystal layer, a fourth orientation layer, and second conductive glass that are sequentially stacked from bottom to top;

the first drive signal and the second drive signal are voltage signals;

the first pixel electrode and the first conductive glass are configured to: mutually cooperate to apply the first drive signal to the first liquid crystal layer, and control a deflection angle of a liquid crystal at the first liquid crystal layer with the cooperation of the first orientation layer and the second orientation layer, where light passing through liquid crystals with different deflection angles has different polarization directions; and the first polarizer is configured to attenuate, to different degrees, intensity of light that passes through the first liquid crystal layer and that has different polarization directions, to implement amplitude modulation on incident light that is used to display the first image and the second image; and the second pixel electrode and the second conductive glass are configured to: mutually cooperate to apply the second drive signal to the second liquid crystal layer, and control a deflection angle of a liquid crystal at the second liquid crystal layer with the cooperation of the third orientation layer and the fourth orientation layer, to implement phase modulation on light output from the first liquid crystal structure.

The foregoing embodiment provides a method for performing amplitude modulation and phase modulation when both the first imaging structure and the second imaging structure are the liquid crystal structures. In addition, the liquid crystal structure is also a mature display structure. Therefore, the liquid crystal structure has good industrial applicability.

With reference to the first aspect, in some embodiments of the first aspect, an included angle between a direction of a fast axis or a slow axis of the second liquid crystal layer and a transmission direction of the first polarizer is 45°, and the direction of the fast axis or the slow axis of the second liquid crystal layer is the same as a direction of a fast axis or a slow axis of the first liquid crystal layer.

It should be understood that, that the direction of the fast axis or the slow axis of the second liquid crystal layer is the same as a direction of a fast axis or a slow axis of the first liquid crystal layer may be that the direction of the fast axis of the second liquid crystal layer is the same as the direction of the slow axis or the fast axis of the first liquid crystal layer, or the direction of the slow axis of the second liquid crystal layer is the same as the direction of the slow axis or the fast axis of the first liquid crystal layer.

When the included angle between the direction of the fast axis or the slow axis of the second liquid crystal layer and the transmission direction of the first polarizer is 45°, two polarization components that are obtained through decomposition of linearly polarized light emitted from the first polarizer and that are in the direction of the fast axis and the direction of the slow axis of the second liquid crystal layer have equal phases and amplitudes, and the polarization components in the direction of the fast axis and the direction of the slow axis each have only a phase delay, and therefore cause no change of another light characteristic. Therefore, it is relatively easy to adjust a phase of the linearly polarized light. In addition, when the direction of the fast axis or the slow axis of the second liquid crystal layer is the same as the direction of the fast axis or the slow axis of the first liquid crystal layer, two beams of light obtained, in a subsequent optical path, through decomposition of the emergent light obtained after the modulation is performed has a largest adjustable intensity range.

With reference to the first aspect, in some embodiments of the first aspect, an angle of the phase modulation ranges from 0° to 180°. Specifically, the first liquid crystal structure and the second liquid crystal structure of the LCOS device may be used to implement the phase modulation at an angle ranging from 0° to 180°.

With reference to the first aspect, in some embodiments of the first aspect, liquid crystals at the first liquid crystal layer and the second liquid crystal layer may be twisted nematic (TN) liquid crystal layers or electrically controlled birefringence (ECB) liquid crystal layers.

With reference to the first aspect, in some embodiments of the first aspect, the first pixel electrode is a reflective pixel electrode, and the incident light is incident from the second conductive glass of the second liquid crystal structure, reflected by the reflective pixel electrode, and then emitted from the second conductive glass.

With reference to the first aspect, in some embodiments of the first aspect, a polarization direction of the incident light is the same as the direction of the fast axis or the slow axis of the second liquid crystal layer.

In this case, the polarization direction of the incident light is the same as a polarization direction of light along the fast axis (or the slow axis) of the second liquid crystal layer. The incident light is incident along the fast axis or the slow axis of the crystal, and the incident light is not refracted in the crystal. Therefore, the crystal does not change a characteristic of the light. When the incident light passes through the second liquid crystal structure, the second liquid crystal structure does not affect the incident light (for example, light intensity and a phase of the incident light do not change).

With reference to the first aspect, in some embodiments of the first aspect, there is a first correspondence between the first drive signal and the deflection angle of the liquid crystal at the first liquid crystal layer, there is a second correspondence between the second drive signal and the deflection angle of the liquid crystal at the second liquid crystal layer, the first drive signal is determined based on the deflection angle of the liquid crystal at the first liquid crystal layer and the first correspondence, and the second drive signal is determined based on the deflection angle of the liquid crystal at the second liquid crystal layer and the second correspondence.

With reference to the first aspect, in some embodiments of the first aspect, the deflection angle of the liquid crystal at the first liquid crystal layer is determined according to Formula (1), and the deflection angle of the liquid crystal at the second liquid crystal layer is determined according to Formula (2):

$$\cos\theta_{1ij} = 4(I_{sij} + I_{pij}) - 1 \tag{1}$$

$$\cos\theta_{2ij} = \frac{I_{sij} - I_{pij}}{I_{sij} + I_{pij}} \tag{2}$$

where in the formulas, i and j represent a pixel unit in a row i and a column j; $\cos\theta_{1ij}$ represents a deflection angle of a liquid crystal, corresponding to a pixel unit in a row i and a column j, at the first liquid crystal layer; $\cos\theta_{2ij}$ represents a deflection angle of a liquid crystal, corresponding to a pixel unit in a row i and a column j, at the second liquid crystal layer; $I_{sij}$ represents light intensity in a row i and a column j in the first image; and $I_{pij}$ represents light intensity in a row i and a column j in the second image.

When both the first imaging structure and the second imaging structure are liquid crystal structures, and are reflective liquid crystal structures in the imaging device, the deflection angle of the liquid crystal is adjusted in the foregoing manner, so that signal modulation and demodulation can be more accurately performed, and a better modulation and demodulation effect can be achieved.

With reference to the first aspect, in some embodiments of the first aspect, the first liquid crystal structure further includes a second polarizer, an upper surface of the second polarizer is bonded to a lower surface of the first pixel electrode, the first pixel electrode is a transparent pixel electrode, and the incident light is incident from the second polarizer, and emitted from the second conductive glass of the second liquid crystal structure; and an included angle between the transmission direction of the first polarizer and a transmission direction of the second polarizer is 90°.

With reference to the first aspect, in some embodiments of the first aspect, a direction of the incident light and the direction of the fast axis or the slow axis of the first liquid crystal layer form an angle of 45°.

The second polarizer is mainly configured to filter the incident light, to obtain linearly polarized light with a polarization direction the same as the transmission direction of the second polarizer. Incident light that is incident from a light source to the liquid crystal device is scattered light, and has different polarization directions. The incident light first passes through the second polarizer, and the incident light is converted into linearly polarized light with a polarization direction the same as the transmission direction of the second polarizer.

The included angle between the transmission direction of the first polarizer and the transmission direction of the second polarizer is 90°, and a polarization direction of light along the fast axis or the slow axis of the first liquid crystal layer is the same as the direction of the fast axis or the slow axis of the second liquid crystal layer. In addition, when the polarization direction of the light along the fast axis or the slow axis of the first liquid crystal layer and the direction of the fast axis or the slow axis of the second liquid crystal layer are in a direction of an angular bisector of the included angle between the transmission direction of the first polarizer and the transmission direction of the second polarizer, both an included angle between a polarization direction of the incident light before the amplitude modulation and the direction of the fast axis or the slow axis of the first liquid crystal layer and an included angle between a polarization direction of the incident light after the amplitude modulation and the direction of the fast axis or the slow axis of the first liquid crystal layer may be 45°. In this way, when the emergent light from the liquid crystal on silicon structure is subsequently decomposed into two beams of light in two polarization directions with an angle of ±45°, the two beams of light obtained through decomposition has a largest adjustable intensity range.

With reference to the first aspect, in some embodiments of the first aspect, the transmissive liquid crystal device may alternatively not include the second polarizer. Incident light emitted from the light source is linearly polarized light. Specifically, the light source may include a light emitting device and a polarizer. Light emitted from the light emitting device may be scattered light. Linearly polarized light may be obtained after the light emitted from the light emitting device passes through the polarizer, and the linearly polarized light may directly pass through the first transparent pixel electrode.

With reference to the first aspect, in some embodiments of the first aspect, there is a first correspondence between the first drive signal output by the first controller and the deflection angle of the liquid crystal at the first liquid crystal layer, there is a second correspondence between the second drive signal output by the first controller and the deflection angle of the liquid crystal at the second liquid crystal layer, the first drive signal is determined based on the deflection angle of the liquid crystal at the first liquid crystal layer and the first correspondence, and the second drive signal is determined based on the deflection angle of the liquid crystal at the second liquid crystal layer and the second correspondence.

With reference to the first aspect, in some embodiments of the first aspect, the deflection angle of the liquid crystal at the first liquid crystal layer is determined according to Formula (3), and the deflection angle of the liquid crystal at the second liquid crystal layer is determined according to Formula (4):

$$\cos\theta_{1ij} = 2(I_{sij} + I_{pij}) - 1 \quad (3)$$

$$\cos\theta_{2ij} = \frac{I_{sij} - I_{pij}}{I_{sij} + I_{pij}} \quad (4)$$

where in the formulas, i and j represent a pixel unit in a row i and a column j; $\cos\theta_{1ij}$ represents a deflection angle of a liquid crystal, corresponding to a pixel unit in a row i and a column j, at the first liquid crystal layer; $\cos\theta_{2ij}$ represents a deflection angle of a liquid crystal, corresponding to a pixel unit in a row i and a column j, at the second liquid crystal layer; $I_{sij}$ represents light intensity in a row i and a column j in the first image; and $I_{pij}$ represents light intensity in a row i and a column j in the second image.

When both the first imaging structure and the second imaging structure are liquid crystal structures, and are transmissive liquid crystal structures in the imaging device, the deflection angle of the liquid crystal is adjusted in the foregoing manner, so that signal modulation and demodulation can be more accurately performed, and a better modulation and demodulation effect can be achieved.

With reference to the first aspect, in some embodiments of the first aspect, a pixel size and an arrangement manner of the first pixel electrode are the same as a pixel size and an arrangement manner of the second pixel electrode, pixels of the first pixel electrode are a plurality of independent circuits onto which the first drive signal is loaded, and pixels of the second pixel electrode are a plurality of independent circuits onto which the second drive signal is loaded.

The pixel size and the arrangement manner of the first pixel electrode are set to be the same as the pixel size and the arrangement manner of the second pixel electrode, so that pixel information at same locations in the two pictures is loaded onto the emergent light corresponding to the same pixel, and no pixel information is lost. In this way, the information about the pixels at the same locations in the two pictures can be loaded for imaging.

With reference to the first aspect, in some embodiments of the first aspect, the first imaging structure is an organic light-emitting diode, and the organic light-emitting diode includes an anode, a cathode, an organic layer, and a polarizer;

the second imaging structure is a liquid crystal structure, and the liquid crystal structure includes a pixel electrode, a first orientation layer, a liquid crystal layer, a second orientation layer, and conductive glass that are sequentially stacked from bottom to top;

the first drive signal is a current signal, and the second drive signal is a voltage signal;

the anode and the cathode are configured to mutually cooperate to apply the first drive signal to the organic layer to output light with intensity corresponding to strength of the first drive signal, to implement amplitude modulation on light used to display the first image and the second image; and the polarizer is configured to restrict a polarization direction of light output from the organic layer; and the pixel electrode and the conductive glass are configured to: mutually cooperate to apply the second drive signal to the liquid crystal layer, and control a deflection angle of a liquid crystal at the liquid crystal layer with the cooperation of the first orientation layer and the second orientation layer, to implement phase modulation on the light output from the organic light-emitting diode.

The foregoing embodiment provides a method for performing amplitude modulation and phase modulation when the first imaging structure is the organic light-emitting diode and the second imaging structure is the liquid crystal structure. In addition, both the organic light-emitting diode structure and the liquid crystal structure are mature display structures, and therefore have good industrial applicability.

With reference to the first aspect, in some embodiments of the first aspect, an included angle between a polarization direction of light along a fast axis or a slow axis of the liquid crystal layer and a transmission direction of the polarizer is 45°.

When an included angle between a direction of the fast axis or the slow axis of the liquid crystal layer and the transmission direction of the polarizer is 45°, two polarization components that are obtained through decomposition of linearly polarized light emitted from the polarizer and that are in the direction of the fast axis and the direction of the slow axis of the liquid crystal layer have equal phases and amplitudes, and the polarization components in the direction of the fast axis and the direction of the slow axis each have only a phase delay, and therefore cause no change of another light characteristic. Therefore, it is relatively easy to adjust a phase of the linearly polarized light.

With reference to the first aspect, in some embodiments of the first aspect, there is a first correspondence between the first drive signal and luminous intensity of a pixel of the organic light-emitting diode, there is a second correspondence between the second drive signal and the deflection angle of the liquid crystal at the liquid crystal layer, the first drive signal is determined based on the luminous intensity of the pixel of the organic light-emitting diode and the first correspondence, and the second drive signal is determined based on the deflection angle of the liquid crystal at the liquid crystal layer and the second correspondence.

With reference to the first aspect, in some embodiments of the first aspect, the luminous intensity of the pixel of the organic light-emitting diode is determined according to Formula (5), and the deflection angle of the liquid crystal at the liquid crystal layer is determined according to Formula (6):

$$I_{1ij} = I_{sij} + I_{pij} \quad (5)$$

$$\cos\theta_{2ij} = \frac{I_{sij} - I_{pij}}{I_{sij} + I_{pij}} \quad (6)$$

where in the formulas, i and j represent a pixel unit in a row i and a column j; $I_{1ij}$ represents luminous intensity of a pixel of a pixel unit in a row i and a column j of the organic light-emitting diode; $\cos\theta_{2ij}$ represents a deflection angle of a liquid crystal, corresponding to a pixel unit in a row i and a column j, at the liquid crystal layer; $I_{sij}$ represents light intensity in a row i and a column j in the first image; and $I_{pij}$ represents light intensity in a row i and a column j in the second image.

In this embodiment in which the first imaging structure is the organic light-emitting diode and the second imaging structure is the liquid crystal structure, the deflection angle of the liquid crystal is adjusted in the foregoing manner, so that signal modulation and demodulation can be more accurately performed, and a better modulation and demodulation effect can be achieved.

With reference to the first aspect, in some embodiments of the first aspect, the imaging device further includes the first controller, the first controller receives a voltage signal sent by a second controller, where the voltage signal carries the pixel information of the first image and the pixel information of the second image; and the first controller converts the voltage signal into the first drive signal and the second drive signal.

According to a second aspect, a display apparatus is provided, including a polarization beam splitter and the imaging device in any one of the first aspect or the optional embodiments of the first aspect, where the polarization beam splitter is configured to decompose emergent light of the imaging device into light in a p-polarization state and light in an s-polarization state, where the light in the p-polarization state is used to form the first image, and the light in the s-polarization state is used to form the second image.

With reference to the second aspect, in some embodiments of the second aspect, when the first imaging structure of the imaging device is a first liquid crystal structure, the display apparatus further includes a light source device, and the light source is configured to provide the incident light for the liquid crystal device.

With reference to the second aspect, in some embodiments of the second aspect, a polarization direction of the light that is obtained through decomposition by the polarization beam splitter and that is in the s-polarization state is the same as the transmission direction of the first polarizer of the first liquid crystal structure.

With reference to the second aspect, in some embodiments of the second aspect, when the incident light is incident from the second polarizer of the first liquid crystal structure of the imaging device, and the emergent light is emitted from the second imaging structure of the imaging device, the light source device and the polarization beam splitter are respectively located on two sides of the imaging device.

With reference to the second aspect, in some embodiments of the second aspect, when the incident light is incident from the second imaging structure of the imaging device, and the emergent light is emitted from the second imaging structure of the imaging device, the light source device and the polarization beam splitter are located on a same side of the imaging device.

With reference to the second aspect, in some embodiments of the second aspect, light emitted from the light source device is linearly polarized light, and a polarization direction of the linearly polarized light is the same as the direction of the fast axis or the slow axis of the second liquid crystal layer.

With reference to the second aspect, in some embodiments of the second aspect, the light source device emits red light, green light, and blue light in a time sequence.

According to a third aspect, an imaging apparatus is provided, where the imaging apparatus includes a second controller and the display apparatus in any one of the second aspect or the optional embodiments of the second aspect, and the second controller sends a voltage signal to a first controller, where the voltage signal carries pixel information of a first image and pixel information of a second image.

According to a fourth aspect, a liquid crystal device preparation method is provided, where the method includes:

preparing a first liquid crystal orientation layer on an upper surface of a first pixel electrode; preparing a second liquid crystal orientation layer on a lower surface of first conductive glass; filling a liquid crystal between the upper surface of the first pixel electrode and the lower surface of the first conductive glass that are sealed, to form a first liquid crystal layer; bonding a first polarizer to an upper surface of the second liquid crystal orientation layer; bonding a second pixel electrode to an upper surface of the first polarizer; preparing a third liquid crystal orientation layer on an upper surface of the second pixel electrode; preparing a fourth liquid crystal orientation layer on a lower surface of second conductive glass; filling liquid crystals between the upper surface of the second pixel electrode and the lower surface of the second conductive glass that are sealed, to form a second liquid crystal layer; and bonding cover glass to an upper surface of the second conductive glass.

In this embodiment of this application, a first liquid crystal structure of the liquid crystal device prepared by using the method receives first incident light, and performs amplitude modulation on the first incident light to obtain second incident light. The second incident light enters a second liquid crystal on silicon structure. The second liquid crystal on silicon structure performs phase modulation on the second incident light, to obtain emergent light from the liquid crystal device. The LCOS device can implement both the amplitude adjustment and the phase adjustment, load pixel information at same locations in two pictures onto emergent light corresponding to a same pixel, and simultaneously output two independent images without increasing an area of an image source and a quantity of pixels.

With reference to the fourth aspect, in some embodiments of the fourth aspect, an included angle between a polarization direction of light along a fast axis or a slow axis of the second liquid crystal layer and a polarization direction of light transmitted through the first polarizer is 45°.

With reference to the fourth aspect, in some embodiments of the fourth aspect, a polarization direction of light along the fast axis or the slow axis of the second liquid crystal layer is the same as a polarization direction of light along a fast axis or a slow axis of the first liquid crystal layer.

With reference to the fourth aspect, in some embodiments of the fourth aspect, the first pixel electrode is a reflective pixel electrode.

With reference to the fourth aspect, in some embodiments of the fourth aspect, the method further includes: bonding a second polarizer to a lower surface of the first pixel electrode, where the first pixel electrode is a transparent pixel electrode.

With reference to the fourth aspect, in some embodiments of the fourth aspect, an included angle between the polarization direction of the light transmitted through the first polarizer and a polarization direction of light transmitted through the second polarizer is 90°.

For effects that can be achieved in the second aspect to the fourth aspect and the embodiments of the second aspect to the fourth aspect, refer to the effects achieved in the first aspect and the embodiments of the first aspect. Details are not described herein again.

DESCRIPTION OF EMBODIMENTS

The following describes embodiments of the technical solutions of this application with reference to the accompanying drawings.

To facilitate understanding of the embodiments of the present invention, the following several concepts are first introduced for purposes of aiding understanding, and not for limiting purposes, before the embodiments of the present invention are described.

S-polarization state and p-polarization state: Light has a polarization characteristic. If a polarization vector of light is in a primary plane of the light (a plane formed by incident light and a normal line is the primary plane), the light is in a p-polarization state. If the polarization vector of the light is perpendicular to the plane, the light is in an s-polarization state. Any input light in a polarization state may be represented as a vector sum of a component S and a component P.

Twisted nematic (TN) liquid crystal layer: An included angle between an uppermost layer and a lowermost layer of the liquid crystal layer is 90°.

Electrically controlled birefringence (ECB) liquid crystal layer: An included angle between an uppermost layer and a lowermost layer of the liquid crystal layer is 0°.

To better understand the embodiments of this application, an existing imaging device is first described briefly. Existing imaging devices are classified into a liquid crystal on silicon (LCOS) device and a conventional liquid crystal display (LCD).

The LCOS device includes two types: a phase modulation LCOS device and an amplitude modulation LCOS device. The following separately describes the two types of LCOS devices in detail.

Figure 1:
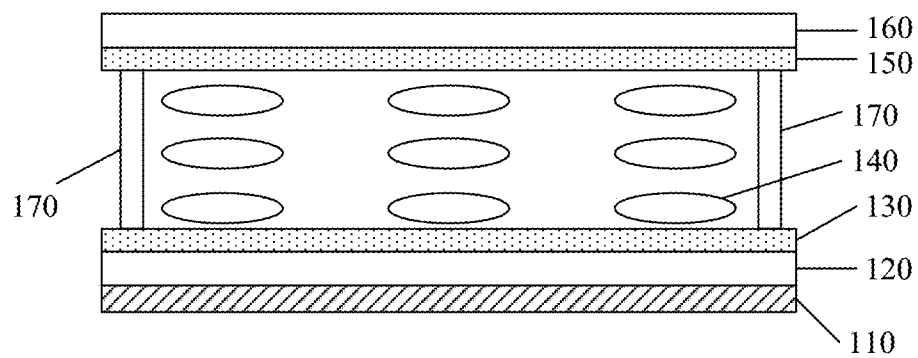
FIG. 1 is a schematic structural diagram of an existing phase modulation liquid crystal on silicon (LCOS) device.

First, the phase modulation LCOS device is described. FIG. 1 is a schematic structural diagram of a phase modulation LCOS device. As shown in FIG. 1, the LCOS device 100 includes a polarizer 110, a pixel electrode 120, a first orientation layer 130, a liquid crystal layer 140, a second orientation layer 150, and indium tin oxide (ITO) semiconductor conductive glass 160 that are sequentially stacked from bottom to top, and a frame sealant 170.

The ITO semiconductor conductive glass 160 is prepared by plating an indium tin oxide film on a basis of sodium calcium-based or silicon boron-based glass substrate by using a magnetron sputtering method, and is mainly used to form an electric field between the indium tin oxide semiconductor conductive glass 160 and the pixel electrode.

The liquid crystal layer 140 includes a liquid crystal. A most important characteristic of the liquid crystal is a dielectric coefficient and a refraction coefficient of the liquid crystal. The dielectric coefficient represents a characteristic of the liquid crystal when the liquid crystal deflects after being affected by an electric field. The refractive index is an important parameter that determines a travel route of light when the light passes through the liquid crystal. A voltage is loaded onto the pixel electrode, to control deflection of the liquid crystal to adjust a polarization direction of the light.

The orientation layers are disposed on an upper surface and a lower surface of the liquid crystal layer 140. The orientation layers (130 and 150) are obtained by coating a polyimide orientation film on each of surfaces that are of an upper conductive glass substrate and a lower conductive glass substrate and that are in contact with the liquid crystal layer. After directional friction is performed by using lint, a plurality of subtle grooves are formed on the orientation film, so that liquid crystals can be arranged in order along an orientation. For the phase modulation LCOS device, an orientation of the orientation layer 130 is parallel with an orientation of the orientation layer 150. When the orientation of the orientation layer 130 is parallel with the orientation of the orientation layer 150, no other impacts are caused if only phase modulation is performed; otherwise, the polarization direction of the light may change. It should be noted that angle deflection of the liquid crystal at the liquid crystal layer is controlled (for example, by applying a voltage to the pixel electrode) with the cooperation of the orientation layers. A specific principle is used by prior approaches, and details are not described herein.

The pixel electrode 120 may be implemented in the following two manners. (1) complementary metal oxide semiconductor (CMOS) circuits form many grid electrodes, and each electrode surface is plated with a reflective film. The electrodes are independent of each other through etching, to form independent "pixels", and a CMOS circuit may independently control a voltage on a surface of each pixel electrode. The pixel electrode may be prepared to be transparent through a special process. (2) Transparent thin-film transistors form independent pixels, and a thin film transistor independently controls a voltage on a surface of each pixel electrode. Different voltages may be applied to a pixel of a pixel electrode, to control deflection of liquid crystals (for example in a depth space whose cross-sectional area has a size almost the same as a size of the pixel in a vertical direction), corresponding to the pixel, at the liquid crystal layer. It should be noted that each pixel may control only one color, or may control a plurality of colors. In this application, to reduce a size, a solution in which one pixel controls a plurality of colors (for example, three colors R, G, and B) is used: Each color may be controlled in a time division multiplexing mode; to be specific, a pixel in the electrode first controls R (red), next controls G (green), and then controls B (blue). A specific control method is used by prior approaches, details are not described herein.

The polarizer 110 is also referred to as a polarizer. Light emitted by a backlight source is usually scattered light, in other words, polarization directions of the light are different. When the light passes through the polarizer 110, the polarizer 110 may filter out light in other polarization directions, and enables only light with a polarization direction the same as a polarization direction of the polarizer 110 to pass through.

It should be noted that the polarizer 110 may usually be integrated with the LCOS device. In other words, the polarizer 110 belongs to the LCOS device. However, the polarizer may alternatively not belong to the LCOS device. In other words, the polarizer is independent of the LCOS device. For example, the LCOS device is separately packaged, and does not include the polarizer. Alternatively, the polarizer may be an independent device located between a light source and the LCOS device, or may be integrated with a light source. All these methods can be used to implement a same function of filtering the scattered light.

The upper conductive glass substrate and the lower conductive glass substrate (the ITO 160 and the pixel electrode 120) of the LCOS device are sealed by using the frame sealant 170. The frame sealant enables the upper conductive glass substrate and the lower conductive glass substrate to be tightly bonded. In addition, the frame sealant is further used surrounding the liquid crystal layer, so that the liquid crystal between the upper conductive glass substrate and the lower conductive glass substrate is externally isolated. A spacing between the upper glass substrate and the lower glass substrate is controlled through spherical silicon dioxide particles. The spherical silicon dioxide particle is also referred to as a spacer, and mainly provides support between the upper glass substrate and the lower glass substrate. The spherical silicon dioxide particles may be evenly distributed between the glass substrates.

For the phase modulation LCOS device, incident light (e.g., scattered light) is first filtered by the polarizer 110, to obtain linearly polarized light; then the linearly polarized light passes through the pixel electrode 120 and the orientation layer 130 (the two layers of structures do not change a characteristic of the light, for example, intensity and a phase of the light), and enters the liquid crystal layer 140. A deflection angle of a liquid crystal at the liquid crystal layer 140 may be adjusted by changing a voltage loaded onto each pixel of the pixel electrode 120. In this way, a phase of the incident light is changed, and the linearly polarized light is changed to circularly polarized light or elliptically polarized light. Specifically, for example, continuous phase modulation within a range of 0 to $2\pi$ may be implemented by loading 255 levels of voltages onto the pixel electrode 120. After the phase modulation is performed, the incident light is emitted from the conductive glass 160.

For the phase modulation LCOS device, after the phase modulation is performed, the incident light no longer passes through the polarizer. In this way, the incident light has no polarization loss or absorption loss. Therefore, highest light conversion efficiency can be achieved.

Figure 2:
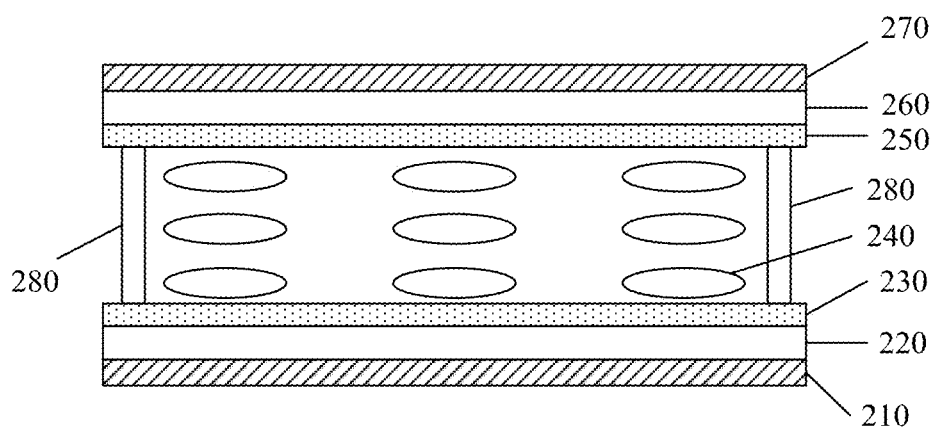
FIG. 2 is a schematic structural diagram of an existing amplitude modulation LCOS device.

FIG. 2 is a schematic structural diagram of an amplitude modulation LCOS device. The LCOS device 200 includes a first polarizer 210, a pixel electrode 220, a first orientation layer 230, a liquid crystal layer 240, a second orientation layer 250, ITO and semiconductor conductive glass 260, a second polarizer 270 that are sequentially stacked from bottom to top, and a frame sealant 280.

For the amplitude modulation LCOS device, after phase modulation is performed on light, the light may further pass through a polarizer (for example, the second polarizer 270 shown in FIG. 2) and then is emitted. The polarizer 270 reduces intensity of incident light. In this way, amplitude modulation is implemented.

For details of the first polarizer 210, the pixel electrode 220, the first orientation layer 230, the liquid crystal layer 240, the second orientation layer 250, the ITO semiconductor conductive glass 260, and the frame sealant 280, respectively refer to related descriptions of the polarizer 110, the pixel electrode 120, the first orientation layer 130, the liquid crystal layer 140, the second orientation layer 150, the ITO semiconductor conductive glass 160, and the frame sealant 170 of the phase modulation LCOS device that are shown in FIG. 1. However, it should be noted that, for the amplitude modulation LCOS device, an orientation of the orientation layer 230 is perpendicular to an orientation of the orientation layer 250. When the orientation of the orientation layer 230 is perpendicular to the orientation of the orientation layer 250, polarization and rotation effects can be maximized, to implement the amplitude modulation.

For the amplitude modulation LCOS device, the incident light first passes through the first polarizer 210 and enters the liquid crystal layer 240, and a deflection angle of a liquid crystal at the liquid crystal layer 240 is adjusted by changing a voltage loaded onto each pixel of the pixel electrode 220. In this way, a phase of the incident light is changed, so that a polarization direction of the light is changed. For example, the light may become circularly polarized light or elliptically polarized light. After the phase-modulated incident light passes through the second polarizer 270, because the incident light is changed to circularly polarized light or elliptically polarized light, a polarization direction of incident light corresponding to each pixel is different from a polarization direction of the second polarizer 270, and intensity of the incident light corresponding to each pixel also varies when the incident light is transmitted through the second polarizer 270. In this way, the amplitude modulation is implemented on the incident light.

It should be noted that the LCOS devices in FIG. 1 and FIG. 2 are both transmissive LCOS devices. "Transmissive" means that incident light is directly "transmitted" from one side of the LCOS device to the other side of the LCOS device. In other words, an optical path is directly propagated from one side to the other side (as shown in FIG. 1 and FIG. 2, light is incident from a lower surface in the figure, and is emitted from an upper surface in the figure).

In prior approaches, there is a reflective LCOS device. For the reflective LCOS device, there is a "reflective" optical path. For example, in FIG. 1 and FIG. 2, if an incident direction of light is incident from an upper surface of the LCOS device, after being reflected by a pixel electrode (which is coated with a reflective material, for example, the pixel electrode is coated with an aluminum film), the light is emitted from the upper surface of the LCOS device. The reflective LCOS device may not include a polarizer that has a polarization function, for example, the polarizer 110 shown in FIG. 1 or the polarizer 210 shown in FIG. 2. In addition, the pixel electrode of the reflective LCOS device is not a transparent pixel electrode that is transparent to an optical path, but is a reflective pixel electrode that is coated with a reflective material. For example, in FIG. 1, for the reflective LCOS device, incident light first passes through the ITO 160 and enters the liquid crystal layer 140, and the incident light re-enters the liquid crystal layer 140 after being reflected by the reflective pixel electrode 120. The deflection angle of the liquid crystal at the liquid crystal layer 140 is adjusted by changing the voltage loaded onto each pixel of the pixel electrode 120. In this way, the phase of the incident light is changed, so that the linearly polarized light is changed to circularly polarized light or elliptically polarized light.

It should be noted that light that is incident to a reflective phase modulation LCOS device needs to be polarized light. In addition, to ensure that a characteristic of the polarized light does not change when the light is incident from an upper surface of the reflective phase modulation LCOS device, a polarization direction of the incident light should be parallel with an orientation of an orientation layer. Light that is incident to the amplitude modulation LCOS device needs to be polarized light. In addition, to ensure that a characteristic of the polarized light does not change when the light is incident from an upper surface of the amplitude modulation LCOS device, an included angle between a polarization direction of the incident light and a direction of a principal axis of the liquid crystal layer should be 45°.

A structure of an existing LCOS device is similar to a structure of a conventional LCD. A difference is as follows: A pixel electrode of the LCD is formed by ITO semiconductor conductive glass, while a pixel electrode of the LCOS device is formed by a silicon-based CMOS. Therefore, for a specific structure of the LCD, refer to that of the LCOS device. To avoid repetition, details are not described herein.

A single existing imaging device can implement only amplitude adjustment or phase adjustment. For example, each pixel of an amplitude modulation imaging device controls only intensity information of the pixel, and each pixel of a phase modulation imaging device controls only phase information of the pixel. Therefore, only information about a single image can be output based on a single pixel.

Figure 3:
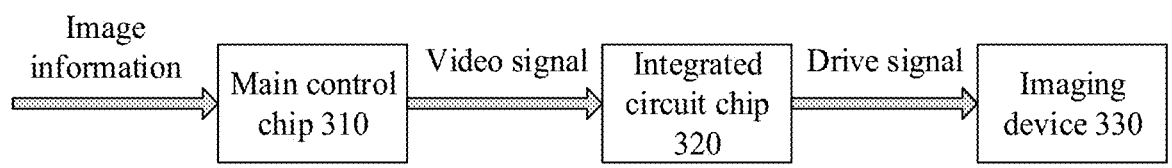
FIG. 3 is a schematic block diagram of an imaging system architecture according to this application.

FIG. 3 is a schematic architectural diagram of an imaging system 300 according to embodiments of this application. As shown in FIG. 3, the system 300 may include a main control chip 310, an integrated circuit (IC) chip 320, and an imaging device 330. The imaging device 330 may be an existing amplitude modulation liquid crystal device or phase modulation liquid crystal device, or may be an imaging device provided in this application. A lead wire corresponding to a pixel electrode of the imaging device 330 is connected to the integrated circuit chip 320 through a flexible printed circuit (FPC). The integrated circuit chip 320 is configured to convert a video signal that is input by the main control chip 310 into a voltage signal, and load the voltage signal to the pixel electrode of the LCOS device 330. The main control chip 310 receives image information from another device (such as a mobile phone or a tablet) or another processor (such as a central processing unit (CPU)) of the imaging system according to various protocols (such as various wired protocols or wireless protocols such as a Type C protocol and a universal serial bus (USB) protocol), and converts the input image information into a video signal (for example, a video signal such as an high density per inch (HDPI) signal, a mobile industry processor interface (MIPI) signal, a red green blue (RGB) signal, or low-voltage differential signaling (LVDS)). The main control chip 310 may be a field programmable gate array (FPGA) chip, an application-specific integrated circuit (ASIC) chip, or various processors (such as a CPU and a graphics processing unit (GPU)) that support an instruction.

In prior approaches, the input image information is information about one image. However, in this application, the input image information may be information about two images. The following describes the solutions of this application in detail through the embodiments.

Figure 4:
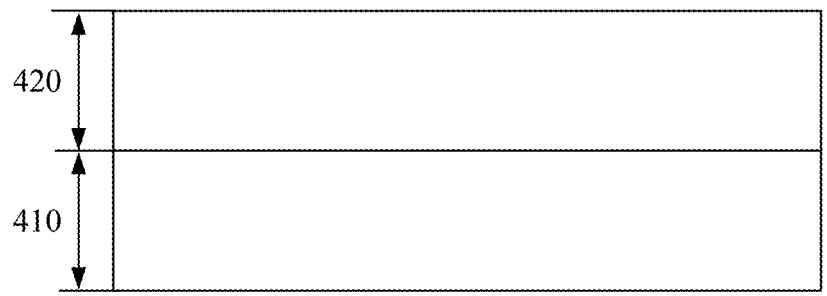
FIG. 4 is a schematic structural diagram of an imaging device according to an embodiment of this application.

FIG. 4 is a schematic structural diagram of an imaging device 400 according to this application. The imaging device 400 includes a first imaging structure 410 and a second imaging structure 420 that are sequentially stacked from bottom to top.

The first imaging structure is configured to perform amplitude modulation on a light signal based on a first drive signal, and output amplitude-modulated light, where the amplitude-modulated light carries pixel information of a first image and pixel information of a second image, and the first drive signal is determined based on light intensity of the first image and light intensity of the second image.

The second imaging structure is configured to perform phase modulation on the amplitude-modulated light based on a second drive signal, so that phase-modulated light can be decomposed into light having two polarization components, where the light having the two polarization components is respectively used to form the first image and the second image, and the second drive signal is determined based on the light intensity of the first image and the light intensity of the second image.

In this embodiment of this application, the first imaging structure of the imaging device performs the amplitude modulation on the light signal based on the first drive signal, and the second imaging structure of the imaging device performs the phase modulation on the amplitude-modulated light based on the second drive signal. Because both the first drive signal and the second drive signal are determined based on the light intensity of the first image and the light intensity of the second image, the light on which the amplitude modulation and the phase modulation are performed by the imaging device can be decomposed into the light having the two polarization components, and the light having the two polarization components is respectively used to form the first image and the second image. In this way, the imaging device can implement both the amplitude adjustment and the phase adjustment, load pixel information of two pictures onto emergent light corresponding to a same pixel, and simultaneously output two independent images without a need to use two liquid crystal devices to perform amplitude modulation respectively on the two pictures. The emergent light of the imaging device may share a subsequent imaging optical path. This avoids a disadvantageous case experienced by prior approaches in which imaging optical paths need to be respectively configured for two amplitude modulation liquid crystal devices, decreases a quantity of components in the device, reduces a size and a weight of the device, and facilitates mobility of the device.

Optionally, the first imaging structure 410 may be a liquid crystal structure, or may be an organic light-emitting diode (OLED) structure. The second imaging structure 420 is a liquid crystal structure.

Optionally, the liquid crystal structure may be a LCOS liquid crystal structure, or may be a conventional LCD structure.

Figure 5:
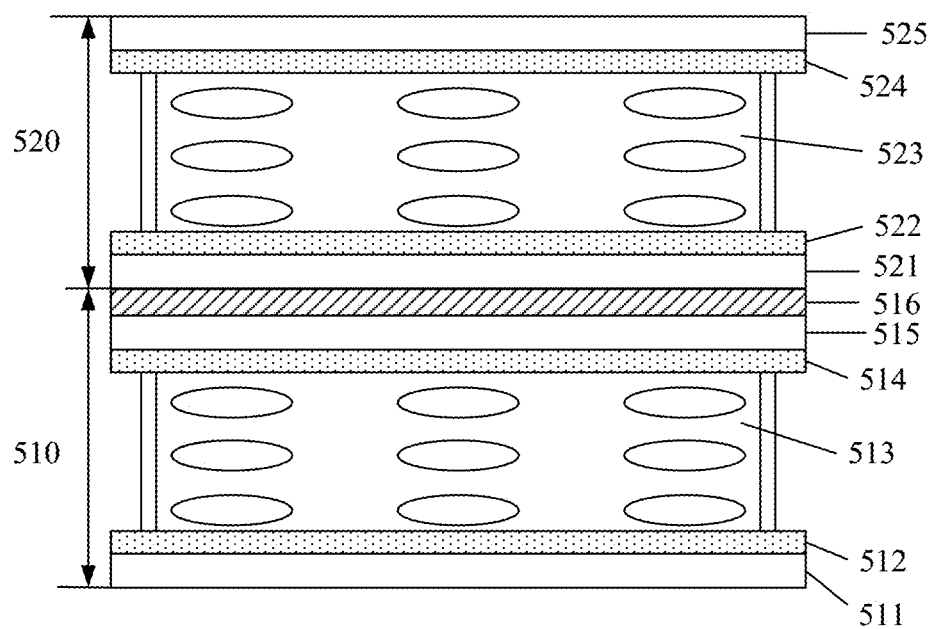
FIG. 5 is a schematic structural diagram of an imaging device according to an embodiment of this application.

FIG. 5 is a schematic structural diagram of an imaging device 500 according to this application. A first imaging structure of the imaging device 500 is a first liquid crystal structure 510. The first liquid crystal structure includes a first pixel electrode 511, a first orientation layer 512, a first liquid crystal layer 513, a second orientation layer 514, first conductive glass 515, and a first polarizer 516 that are sequentially stacked from bottom to top.

The second imaging structure of the imaging device 500 is a second liquid crystal structure 520. The second liquid crystal structure includes a second pixel electrode 521, a third orientation layer 522, a second liquid crystal layer 523, a fourth orientation layer 524, and second conductive glass 525 that are sequentially stacked from bottom to top.

The first drive signal and the second drive signal are voltage signals.

The first pixel electrode 511 and the first conductive glass 515 are configured to: mutually cooperate to apply the first drive signal to the first liquid crystal layer, and control a deflection angle of a liquid crystal at the first liquid crystal layer with the cooperation of the first orientation layer 512 and the second orientation layer 514, where light passing through liquid crystals with different deflection angles has different polarization directions. The first polarizer 516 is configured to attenuate, to different degrees, intensity of light that passes through the first liquid crystal layer 513 and that has different polarization directions, to implement amplitude modulation on incident light that is used to display the first image and the second image.

The second pixel electrode 521 and the second conductive glass 525 are configured to mutually cooperate to apply the second drive signal to the second liquid crystal layer 523, and control a deflection angle of a liquid crystal at the second liquid crystal layer 523 with the cooperation of the third orientation layer 522 and the fourth orientation layer 524, to implement phase modulation on light output from the first liquid crystal structure.

For a structure of the first liquid crystal structure 510, refer to a structure of a corresponding part of the amplitude modulation LCOS device shown in FIG. 2. For a structure of the second liquid crystal structure 520, refer to a structure of a corresponding part of the phase modulation LCOS device shown in FIG. 1. Details are not described herein again.

In this embodiment, the first liquid crystal structure 510 of the imaging device 500 is configured to receive the incident light. After the incident light enters the first liquid crystal structure 510, the first pixel electrode 511 and the first conductive glass 515 are configured to: mutually cooperate to apply the first drive signal to the first liquid crystal layer 513, and control the deflection angle of the liquid crystal at the first liquid crystal layer with the cooperation of the first orientation layer 512 and the second orientation layer 514, where light passing through liquid crystals with different deflection angles has different polarization directions. In this way, the phase modulation is performed on the incident light, so that linearly polarized light is changed to circularly polarized light or elliptically polarized light. After the phase-modulated incident light passes through the first polarizer 516, because the incident light is changed to circularly polarized light or elliptically polarized light, a polarization direction of incident light corresponding to each pixel is different from a polarization direction of the polarizer 516, and intensity of the incident light corresponding to each pixel also varies when the incident light is transmitted through the first polarizer 516. The first polarizer is configured to attenuate, to different degrees, the intensity of the light that passes through the first liquid crystal layer and that has different polarization directions. In this way, the first liquid crystal structure 510 implements the amplitude modulation on the incident light that is used to display the first image and the second image. The amplitude-modulated incident light enters the second liquid crystal structure 520. The second pixel electrode 521 and the second conductive glass 525 are configured to mutually cooperate to apply the second drive signal to the second liquid crystal layer 523, and control the deflection angle of the liquid crystal at the second liquid crystal layer 523 with the cooperation of the third orientation layer 522 and the fourth orientation layer 524, to implement the phase modulation on the light output from the first liquid crystal structure, to obtain emergent light from the imaging device 500.

After the incident light enters the first liquid crystal structure 510, the amplitude modulation is performed on the incident light based on the loaded first drive signal. After the amplitude-modulated incident light enters the second liquid crystal structure 520, the phase modulation is performed on the incident light based on the loaded second drive signal. Both the first drive signal and the second drive signal are determined based on light intensity of the first image and light intensity of the second image. The first drive signal and the second drive signal are loaded, so that information about the two images is carried on one pixel. In this way, the imaging device can implement both the amplitude adjustment and the phase adjustment, load pixel information of two pictures onto emergent light corresponding to a same pixel, and simultaneously output two independent images without a need to use two liquid crystal devices to perform amplitude modulation respectively on the two pictures. The liquid crystal device may share a subsequent imaging optical path. This avoids a disadvantageous case experienced by prior approaches in which imaging optical paths need to be respectively configured for amplitude modulation liquid crystal devices, decreases a quantity of components in the device, reduces a size and a weight of the device, and facilitates mobility of the device.

A person skilled in the art may understand that pixel information of each image is information used to represent a pixel point of the image. For example, in this application, when a pixel point of each image includes three colors R, G, and B, there may be values (that is, intensity) of the three colors R, G, and B. During modulation, when the solution in which one pixel controls a plurality of colors is used for a pixel electrode, each pixel of the pixel electrode may control each color in a time division multiplexing mode, to process a pixel point of the image. To be specific, when a pixel of the pixel electrode is used to process a pixel point of the image, the pixel of the pixel electrode actually performs control processing for three times.

In an embodiment, an included angle between a direction of a fast axis or a slow axis of the second liquid crystal layer 523 and a transmission direction of the first polarizer 516 is 45°, and the direction of the fast axis or the slow axis of the second liquid crystal layer is the same as a direction of a fast axis or a slow axis of the first liquid crystal layer.

It should be understood that, that the direction of the fast axis or the slow axis of the second liquid crystal layer is the same as a direction of a fast axis or a slow axis of the first liquid crystal layer may be that the direction of the fast axis of the second liquid crystal layer is the same as the direction of the slow axis or the fast axis of the first liquid crystal layer, or the direction of the slow axis of the second liquid crystal layer is the same as the direction of the slow axis or the fast axis of the first liquid crystal layer. In this case, two beams of light that are obtained, in a subsequent optical path, through decomposition of the emergent light obtained after the modulation is performed has a largest adjustable intensity range.

When the included angle between the direction of the fast axis or the slow axis of the second liquid crystal layer and the transmission direction of the first polarizer 516 is 45°, two polarization components that are obtained through decomposition of linearly polarized light emitted from the first polarizer 516 and that are in the direction of the fast axis and the direction of the slow axis of the second liquid crystal layer have equal phases and amplitudes, and the polarization components in the direction of the fast axis and the direction of the slow axis each have only a phase delay, and therefore cause no change of another light characteristic. Therefore, it is relatively easy to adjust a phase of the linearly polarized light.

It should be understood that the included angle between the direction of the fast axis or the slow axis of the second liquid crystal layer and the transmission direction of the first polarizer is not limited in this application, and the included angle between the direction of the fast axis or the slow axis of the second liquid crystal layer and the transmission direction of the first polarizer may alternatively have another value.

It should be further understood that, that the direction of the fast axis or the slow axis of the second liquid crystal layer is the same as a direction of a fast axis or a slow axis of the first liquid crystal layer is not limited in this application either, and the direction of the fast axis or the slow axis of the second liquid crystal layer may be different from the direction of the fast axis or the slow axis of the first liquid crystal layer.

In this embodiment, when the first imaging structure of the imaging device is the first liquid crystal structure, and the second imaging structure of the imaging device is the second liquid crystal structure, the imaging device may be classified into a reflective imaging device and a transmissive imaging device. The following separately describes the two types of imaging devices in detail.

Optionally, an angle of the phase modulation ranges from 0° to 180°. Specifically, the first liquid crystal structure and the second liquid crystal structure of the LCOS device may be used to implement the phase modulation at an angle ranging from 0° to 180°.

Optionally, liquid crystals at the first liquid crystal layer and the second liquid crystal layer may be TN liquid crystal layers or electrically controlled birefringence (ECB) liquid crystal layers.

In this application, the liquid crystal device may be a reflective liquid crystal device or a transmissive liquid crystal device. The following separately describes the two types of liquid crystal devices.

(1) Reflective Liquid Crystal Device:

Optionally, the first pixel electrode is a reflective pixel electrode. The incident light is incident from the second conductive glass of the second imaging structure of the liquid crystal device, arrives at the reflective pixel electrode after passing through a plurality of layers inside the liquid crystal device, and is reflected by the reflective pixel electrode. Then, after passing through the plurality of layers inside the liquid crystal device, the incident light is emitted from the second conductive glass of the second imaging structure.

Optionally, a polarization direction of the incident light is the same as the direction of the fast axis or the slow axis of the second liquid crystal layer.

Figure 6:
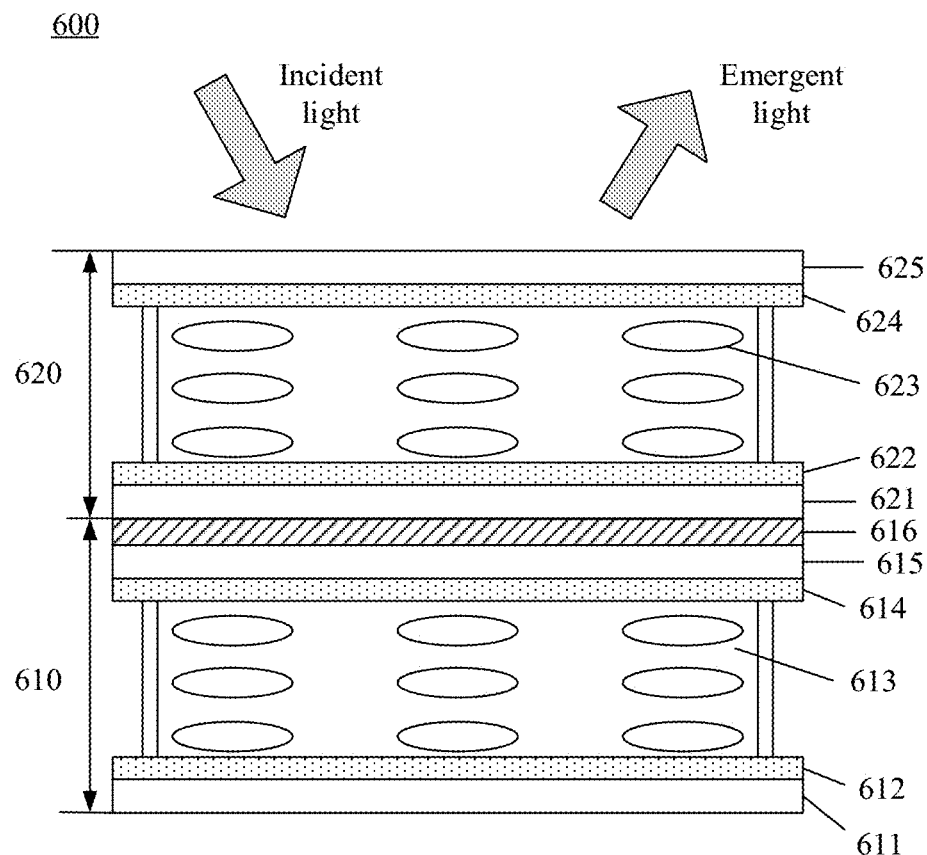
FIG. 6 is a schematic structural diagram of an imaging device according to an embodiment of this application.

The following specifically describes the reflective liquid crystal device based on FIG. 6.

FIG. 6 is a structural block diagram of a reflective liquid crystal device 600. The liquid crystal device 600 includes a first liquid crystal structure 610 and a second liquid crystal structure 620 that are sequentially stacked from bottom to top. The first liquid crystal structure 610 includes a first reflective pixel electrode 611, a first orientation layer 612, a first liquid crystal layer 613, a second orientation layer 614, first conductive glass 615, and a first polarizer 616 that are sequentially stacked from bottom to top. The first liquid crystal structure 610 is configured to perform amplitude modulation on incident light. The second liquid crystal structure includes a second pixel electrode 621, a third orientation layer 622, a second liquid crystal layer 623, a fourth orientation layer 624, and second conductive glass 625 that are sequentially stacked from bottom to top. The second liquid crystal structure 620 is configured to perform phase modulation on amplitude-modulated incident light.

The first liquid crystal structure 610 performs the amplitude modulation on the incident light based on a loaded first drive signal, where the first drive signal is determined based on light intensity of a first image and light intensity of a second image. The second liquid crystal structure performs the phase modulation on the amplitude-modulated incident light based on a loaded second drive signal, where the second drive signal is determined based on the light intensity of the first image and the light intensity of the second image.

The first reflective pixel electrode 611 and the first conductive glass 615 are configured to: mutually cooperate to apply the first drive signal to the first liquid crystal layer 613, and control a deflection angle of a liquid crystal at the first liquid crystal layer 613 with the cooperation of the first orientation layer 612 and the second orientation layer 614, where light passing through liquid crystals with different deflection angles has different polarization directions. The first polarizer 616 is configured to attenuate, to different degrees, intensity of light that passes through the first liquid crystal layer 613 and that has different polarization directions, to implement amplitude modulation on incident light that is used to display the first image and the second image. The second pixel electrode 621 and the second conductive glass 625 are configured to: mutually cooperate to apply the second drive signal to the second liquid crystal layer 623, and control a deflection angle of a liquid crystal at the second liquid crystal layer with the cooperation of the third orientation layer 622 and the fourth orientation layer 624, to implement phase modulation on light output from the first liquid crystal structure 610.

The light that is incident to the reflective liquid crystal device 600 is incident from the second conductive glass 625 of the second imaging structure 620. The incident light passes through the second liquid crystal structure 620 and enters the first liquid crystal structure 610. In this embodiment, a polarization direction of the incident light is the same as a polarization direction of light along a fast axis (or a slow axis) of the second liquid crystal layer. In this case, the incident light is incident along the fast axis or the slow axis of the crystal, and the incident light is not refracted in the crystal. Therefore, the crystal does not change a characteristic of the light. When the incident light passes through the second liquid crystal structure 620, the second liquid crystal structure 620 does not affect the incident light (for example, light intensity and a phase of the incident light do not change).

After passing through the second liquid crystal structure 620 and entering the first liquid crystal structure 610, the incident light first arrives at the first polarizer 616, and passes through the first polarizer 616. Then, the incident light sequentially passes through the first conductive glass 615, the second orientation layer 614, the first liquid crystal layer 613, the first orientation layer 612, and the first reflection pixel electrode 611 from top to bottom. After being reflected by the surface of the first reflection pixel electrode 611, the incident light sequentially passes through the first orientation layer 612, the first liquid crystal layer 613, the second orientation layer 614, the first conductive glass 615, and the first polarizer 616 from bottom to top.

In this embodiment, the first reflective pixel electrode 611 and the first conductive glass 615 are configured to mutually cooperate to apply the first drive signal to the first liquid crystal layer 613, to form an electric field between the first reflective pixel electrode 611 and the first conductive glass 615, and control the deflection angle of the liquid crystal at the first liquid crystal layer 613 with the cooperation of the first orientation layer 612 and the second orientation layer 614, to implement the phase modulation on the incident light, so that linearly polarized light is changed to circularly polarized light or elliptically polarized light. After the phase-modulated incident light passes through the first polarizer 616, because the incident light is changed to circularly polarized light or elliptically polarized light, a polarization direction of incident light corresponding to each pixel is different from a polarization direction of the first polarizer 616, and intensity of the incident light corresponding to each pixel also varies when the incident light is transmitted through the first polarizer 616. In this way, the amplitude modulation is implemented on the incident light.

The amplitude-modulated incident light sequentially passes through the second pixel electrode 621, the third orientation layer 622, the second liquid crystal layer 623, the fourth orientation layer 624, and the second conductive glass 625 from bottom to top. The second pixel electrode 621 and the second conductive glass 625 are configured to: mutually cooperate to apply the second drive signal to the second liquid crystal layer 623, to form an electric field between the second pixel electrode 621 and the second conductive glass 625, and control the deflection angle of the liquid crystal at the second liquid crystal layer with the cooperation of the third orientation layer 622 and the fourth orientation layer 624, so that linearly polarized light is changed to circularly polarized light or elliptically polarized light, to implement the phase modulation on the incident light, to obtain emergent light from the imaging device. Because both the first drive signal and the second drive signal are determined based on the light intensity of the first image and the light intensity of the second image, when the first drive signal and the second drive signal are loaded, pixel information of the two images can be carried on one pixel unit.

(2) Transmissive Liquid Crystal Device:

Optionally, for a transmissive liquid crystal device, the first liquid crystal structure may further include a second polarizer, and an upper surface of the second polarizer is bonded to a lower surface of the first pixel electrode. The first pixel electrode is a transparent pixel electrode. The incident light is incident from the second polarizer, and emitted from the second conductive glass of the second liquid crystal structure. An included angle between the transmission direction of the first polarizer and a transmission direction of the second polarizer is 90°.

Optionally, a direction of the incident light and the direction of the fast axis or the slow axis of the first liquid crystal layer form an angle of 45°.

Figure 7:
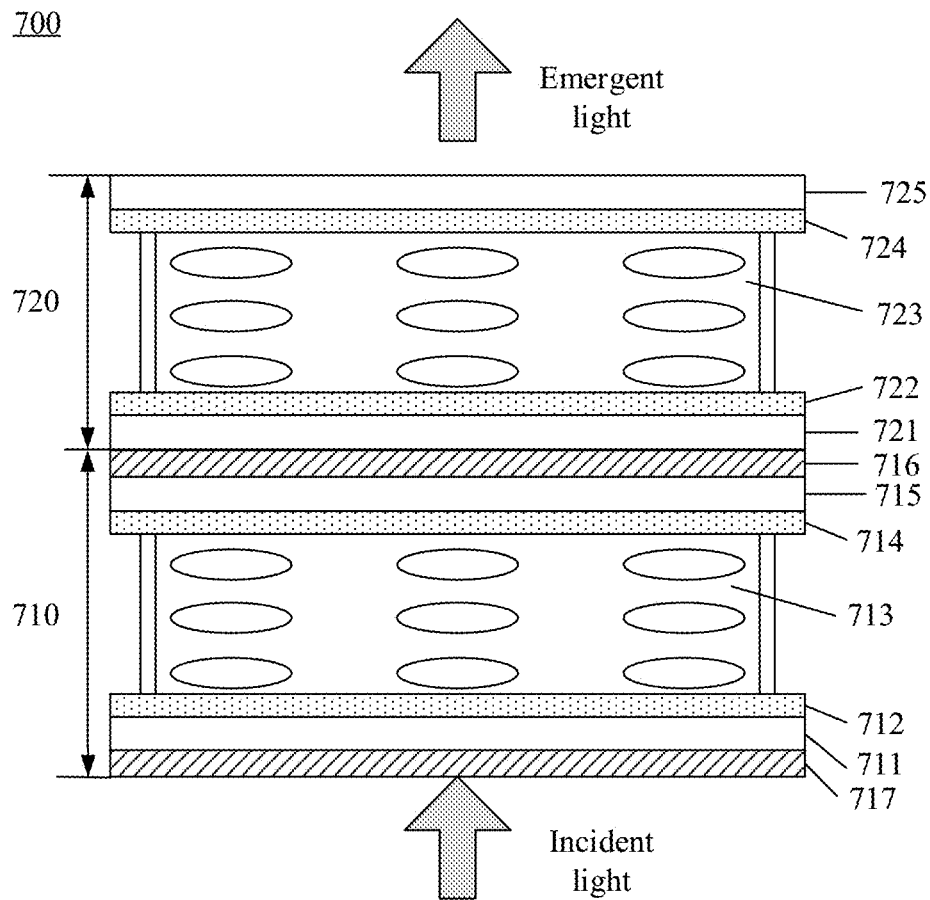
FIG. 7 is a schematic structural diagram of an imaging device according to an embodiment of this application.

Specifically, FIG. 7 is a structural block diagram of a transmissive liquid crystal device 700. The first liquid crystal structure further includes a second polarizer 717, and an upper surface of the second polarizer 717 is bonded to a lower surface of a first pixel electrode 711. The first pixel electrode is a transparent pixel electrode. The liquid crystal device 700 includes the first liquid crystal structure 710 and a second liquid crystal structure 720 that are sequentially stacked from bottom to top.

The first liquid crystal structure 710 includes the second polarizer 717, the first transparent pixel electrode 711, a first orientation layer 712, a first liquid crystal layer 713, a second orientation layer 714, first conductive glass 715, and a first polarizer 716 that are sequentially stacked from bottom to top.

The second liquid crystal structure includes a second pixel electrode 721, a third orientation layer 722, a second liquid crystal layer 723, a fourth orientation layer 724, and second conductive glass 725 that are sequentially stacked from bottom to top.

The first drive signal and the second drive signal are voltage signals. The first liquid crystal structure performs amplitude modulation on incident light based on the first drive signal, where the first drive signal is determined based on light intensity of a first image and light intensity of a second image. The second liquid crystal structure performs phase modulation on amplitude-modulated incident light based on the second drive signal, where the second drive signal is determined based on the light intensity of the first image and the light intensity of the second image.

Specifically, the second polarizer 717 is mainly configured to filter the incident light, to obtain linearly polarized light with a polarization direction the same as a transmission direction of the second polarizer 717. Incident light that is incident from a light source to the liquid crystal device 700 is scattered light, and has different polarization directions. The incident light first passes through the second polarizer 717, and the incident light is converted into linearly polarized light with a polarization direction the same as the transmission direction of the second polarizer 717.

In this embodiment of this application, the first reflective pixel electrode 711 and the first conductive glass 715 are configured to mutually cooperate to apply the first drive signal to the first liquid crystal layer 713, to form an electric field between the first reflective pixel electrode 711 and the first conductive glass 715, and control a deflection angle of a liquid crystal at the first liquid crystal layer 713 with the cooperation of the first orientation layer 712 and the second orientation layer 714, to implement the phase modulation on the incident light, so that the linearly polarized light is changed to circularly polarized light or elliptically polarized light. After the phase-modulated incident light passes through the first polarizer 716, because the incident light is changed to circularly polarized light or elliptically polarized light, a polarization direction of incident light corresponding to each pixel unit is different from a polarization direction of the first polarizer 716, and intensity of the incident light corresponding to each pixel unit also varies when the incident light is transmitted through the first polarizer 716. In this way, the amplitude modulation is implemented on the incident light.

The amplitude-modulated incident light sequentially passes through the second pixel electrode 721, the third orientation layer 722, the second liquid crystal layer 723, the fourth orientation layer 724, and the second conductive glass 725 from bottom to top. The second pixel electrode 721 and the second conductive glass 725 are configured to: mutually cooperate to apply the second drive signal to the second liquid crystal layer 723, to form an electric field between the second pixel electrode 721 and the second conductive glass 725, and control a deflection angle of a liquid crystal at the second liquid crystal layer with the cooperation of the third orientation layer 722 and the fourth orientation layer 724, to obtain emergent light from the liquid crystal device. Because both the first drive signal and the second drive signal are determined based on the light intensity of the first image and the light intensity of the second image, when the first drive signal and the second drive signal are loaded, pixel information of the two images can be carried on one pixel unit. In this way, the emergent light carries independent information about the two images.

In another embodiment, the transmissive liquid crystal device may alternatively not include the second polarizer 717. Incident light emitted from the light source is linearly polarized light. Specifically, the light source may include a light emitting device and a polarizer. Light emitted from the light emitting device may be scattered light. Linearly polarized light may be obtained after the light emitted from the light emitting device passes through the polarizer, and the linearly polarized light may directly pass through the first transparent pixel electrode 711. A subsequent light processing process is the same as a light processing process of the foregoing transmissive liquid crystal device. To avoid repetition, details are not described herein again.

Figure 8:
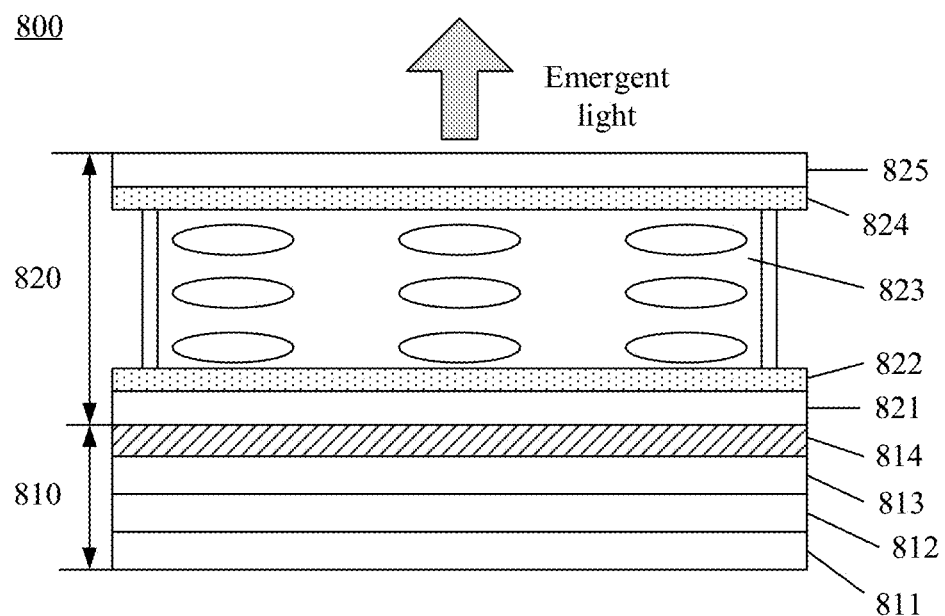
FIG. 8 is a schematic structural diagram of an imaging device according to an embodiment of this application.

FIG. 8 is a schematic structural diagram of an imaging device 800 according to this application. A first imaging structure 810 of the imaging device 800 is an OLED structure. The OLED structure includes an anode 811, an organic layer 812, a cathode 813, and a polarizer 814.

The second imaging structure 820 is a liquid crystal structure. The liquid crystal structure includes a pixel electrode 821, a first orientation layer 822, a liquid crystal layer 823, a second orientation layer 824, and conductive glass 825 that are sequentially stacked from bottom to top. The first drive signal is a current signal, and the second drive signal is a voltage signal.

The anode 813 and the cathode 811 are configured to mutually cooperate to apply the first drive signal to the organic layer 812, to output light with intensity corresponding to strength of the first drive signal, to implement amplitude modulation on light that is used to display the first image and the second image. The polarizer 814 is configured to restrict a polarization direction of light that is output from the organic layer 812.

The pixel electrode 821 and the conductive glass 825 are configured to mutually cooperate to apply the second drive signal to the liquid crystal layer 823, and control a deflection angle of a liquid crystal at the liquid crystal layer 823 with the cooperation of the first orientation layer 822 and the second orientation layer 824, to implement phase modulation on the light output from the organic light-emitting diode.

It should be understood that, in addition to the cathode and the anode, the OLED structure further includes a substrate and the organic layer. The substrate is used as a carrier of the OLED to provide a function such as support, and a material such as glass or plastic may be used to prepare the substrate. The organic layer is prepared by using an organic material, and is used to generate light by applying a current signal to the cathode and the anode. In an example, the organic layer may include an electronic transport layer, a light emitting layer, and a hole transport layer. The entire OLED structure sequentially includes the substrate, the anode, the electronic transport layer, the light emitting layer, the hole transport layer, the cathode, and the polarizer from bottom to top.

It should be further understood that, for a structure of the liquid crystal structure 820, refer to a structure of a corresponding part of the phase modulation LCOS device shown in FIG. 1. Details are not described herein again.

Optionally, an included angle between a polarization direction of light along a fast axis or a slow axis of the liquid crystal layer and a transmission direction of the polarizer is 45°.

In this case, a pixel size and an arrangement manner of the first pixel electrode are set to be the same as a pixel size and an arrangement manner of the second pixel electrode, so that pixel information at same locations in two pictures is loaded onto emergent light corresponding to a same pixel, and no pixel information is lost. In this way, the information about the pixels at the same locations in the two pictures can be loaded for imaging.

Figure 9:
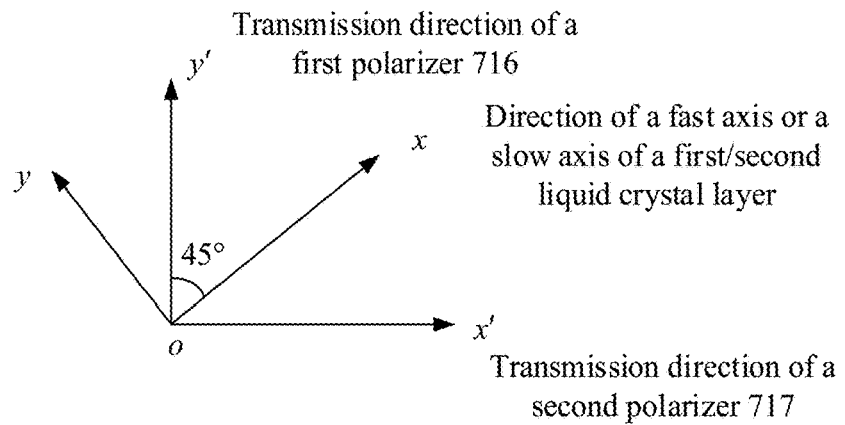
FIG. 9 shows a coordinate reference system of an imaging device.

Based on the foregoing embodiments, to better understand the embodiments of this application, in this embodiment, a polarization direction of light in the embodiments of this application is described with reference to FIG. 9. A coordinate reference system shown in FIG. 9 is a coordinate reference system for the foregoing devices. The coordinate system is a coordinate system for a top view of the imaging device, for example, a top view from top to bottom in FIG. 7. In this application, a propagation direction of light may be considered to be a z-axis direction in the coordinate reference system. This application discusses only the polarization direction. Therefore, for brevity of description, the z-axis direction is not shown in the coordinate reference system, and propagation of light in the z-axis direction is not described.

The following specifically describes the polarization direction of the light in this application by using the imaging device 700 as an example. In the coordinate reference system, an x' axis represents the transmission direction of the second polarizer 717, and a y' axis represents a transmission direction of the first polarizer 716. In this embodiment, an included angle (a first angle) between the x' axis and the y' axis is 90°.

The fast axis or the slow axis of the first liquid crystal layer 713 is in a direction of an angular bisector of the first angle, where the direction is represented by an x axis in FIG. 9. A fast axis or a slow axis of the second liquid crystal layer 723 is also in the direction of the angular bisector of the first angle, namely, in the direction of the x axis in FIG. 9.

If the x axis in FIG. 9 is set as a start axis, the transmission direction of the second polarizer 717 is 135° (or −45°, where in this application, an angle is calculated based on counter-clockwise rotation), namely, an x'-axis direction, and the transmission direction of the first polarizer is 45°, namely, a y'-axis direction.

It should be understood that, in this embodiment of this application, when the liquid crystal device needs to perform amplitude modulation, the transmission direction of the second polarizer 717 is set to 135°, and the transmission direction of the first polarizer 716 is set to 45°, to meet that the included angle between the transmission direction of the first polarizer and the transmission direction of the second polarizer is 90°. Because the included angle between the transmission direction of the first polarizer and the transmission direction of the second polarizer is 90°, and the fast axis or the slow axis of the first liquid crystal layer 713 is in the x'-axis direction, when the fast axis or the slow axis of the second liquid crystal layer 723 is also in the x'-axis direction, both an included angle between a polarization direction of the incident light before the amplitude modulation and the direction of the fast axis or the slow axis of the first liquid crystal layer 713 and an included angle between a polarization direction of the incident light after the amplitude modulation and the direction of the fast axis or the slow axis of the first liquid crystal layer 713 may be 45°. In this way, when the emergent light from the liquid crystal on silicon structure is subsequently decomposed into two beams of light in two polarization directions with an angle of ±45°, the two beams of light obtained through decomposition has a largest adjustable intensity range.

It should be further understood that the transmission direction of the first polarizer 716 and the transmission direction of the second polarizer 717 are not limited in this application, and the direction of the fast axis or the slow axis of the first liquid crystal layer 713 and the direction of the fast axis or the slow axis of the second liquid crystal layer 723 are not limited in this application either. The transmission direction of the first polarizer 716 and the transmission direction of the second polarizer 717, and the direction of the fast axis or the slow axis of the first liquid crystal layer 713 and the direction of the fast axis or the slow axis of the second liquid crystal layer 723 may form other angles.

For a coordinate system of the reflective liquid crystal device 600, refer to the foregoing descriptions. A difference lies in that the reflective liquid crystal device 600 does not include a second polarizer. Other descriptions are the same. For details, refer to corresponding descriptions for understanding.

Optionally, the imaging device further includes a first controller. The first controller receives a voltage signal sent by a second controller, where the voltage signal carries pixel information of the first image and pixel information of the second image. The first controller converts the voltage signal into the first drive signal and the second drive signal.

Figure 10:
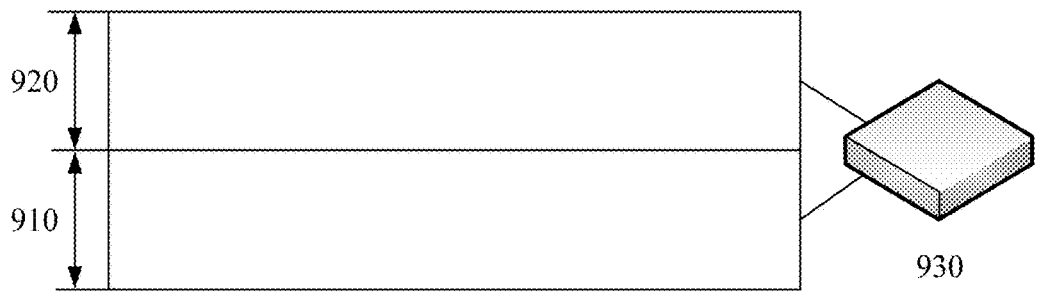
FIG. 10 is a schematic structural diagram of an imaging device according to an embodiment of this application.

Specifically, FIG. 10 shows an imaging device 900 according to this application. The imaging device 900 includes a first imaging structure 910 and a second imaging structure 920 that are sequentially stacked from bottom to top, and the first controller 930. The first controller receives a voltage signal sent by a second controller, where the voltage signal carries pixel information of the first image and pixel information of the second image. The first controller converts the voltage signal into the first drive signal and the second drive signal, and loads the first drive signal onto the first imaging structure, and the first imaging structure performs amplitude modulation on a light signal based on the first drive signal, and outputs amplitude-modulated light. The first controller loads the second drive signal onto the second imaging structure, and the second imaging structure performs phase modulation on the amplitude-modulated light based on the second drive signal. In this way, phase-modulated light can be decomposed into light having two polarization components, and the light having the two polarization components is respectively used to form the first image and the second image.

It should be understood that the second controller may be the main control chip in FIG. 3, and the first controller may be the integrated circuit chip in FIG. 3. Certainly, the controllers may be implemented by other hardware. This is not limited in this application.

It should be understood that for specific processes in which the first imaging structure performs the amplitude modulation on the light signal based on the first drive signal and the second imaging structure performs the phase modulation on the amplitude-modulated light based on the second drive signal, refer to the foregoing embodiments. Details are not described herein again.

Figure 11:
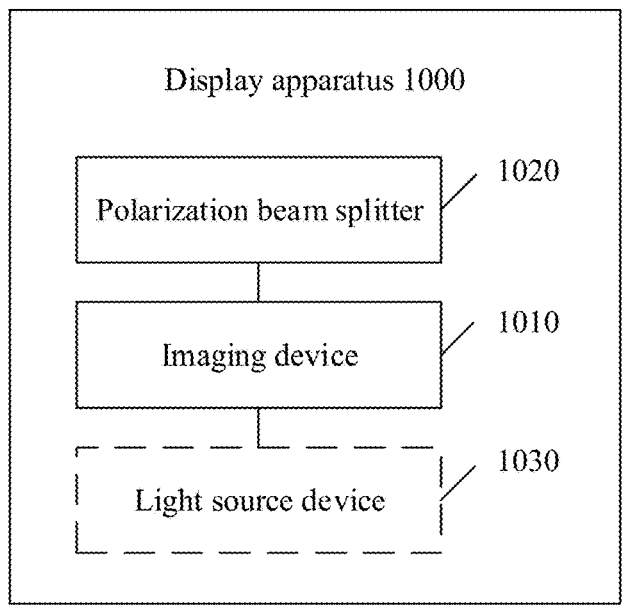
FIG. 11 is a schematic structural diagram of a display apparatus according to an embodiment of this application.

Based on the foregoing embodiments, this embodiment discloses a display apparatus. As shown in FIG. 11, the display apparatus 1000 includes an imaging device 1010 and a polarization beam splitter 1020. The imaging device 1010 may be the imaging device (for example, any one of the imaging devices 400, 500, 600, 700, 800, and 900) in the foregoing embodiments. The polarization beam splitter is configured to decompose emergent light from the liquid crystal device into light in a p-polarization state and light in an s-polarization state. The light in the p-polarization state is used to form the first image, and the light in the s-polarization state is used to form the second image.

In this embodiment of this application, the imaging device 1010 in the display apparatus can implement both amplitude adjustment and phase adjustment, and load pixel information at same locations in two pictures onto emergent light corresponding to a same pixel unit. This avoids using two liquid crystal devices to respectively perform the amplitude adjustment and the phase adjustment, decreases a quantity of components in the display apparatus, reduces a size of the display apparatus, and reduces a weight of the display apparatus.

Optionally, when the first imaging structure of the imaging device is a first liquid crystal structure, the display apparatus further includes a light source device 1030. The light source is configured to provide incident light for the liquid crystal device.

Optionally, a polarization direction of the light that is obtained through decomposition by the polarization beam splitter and that is in the s-polarization state is the same as the transmission direction of the first polarizer of the liquid crystal device.

Specifically, a location of the polarization beam splitter 1020 is determined according to such a principle that the polarization direction of the light that is obtained by decomposing the emergent light by the polarization beam splitter 1020 and that is in the s-polarization state is the same as a polarization direction of light transmitted through the first polarizer of the liquid crystal device. In this case, the polarization beam splitter 1020 can perform optimal decomposition.

To understand this application more clearly, the following describes a method for determining an angle of the polarization beam splitter 1020. The liquid crystal device 1010 sets one of two pictures to black, and sets the other picture to white. Then, the polarization beam splitter 1020 is slowly rotated. When a brightness contrast between two emitted pictures is largest, the polarization beam splitter 1020 is located at a location for the optimal decomposition. To be specific, at the location, the polarization direction of the light that is obtained through decomposition by the polarization beam splitter 1020 and that is in the s-polarization state is the same as a polarization direction of the second polarizer of the liquid crystal device. It should be understood that it is common sense in the art for how to determine the location of the polarization beam splitter 1020 according to the principle that the polarization direction of the light that is obtained by decomposing the emergent light by the polarization beam splitter 1020 and that is in the s-polarization state is the same as the polarization direction of the light transmitted through the first polarizer of the liquid crystal device. Details are not described herein.

Within an error tolerance range, there is an angle deviation between the polarization direction of the light in the s-polarization state and the polarization direction of the light transmitted through the first polarizer of the liquid crystal device. The polarization direction of the light that is obtained by decomposing the emergent light and that is in the s-polarization state is not limited in this embodiment of this application.

Optionally, when the incident light is incident from the second polarizer of the first liquid crystal structure of the imaging device, and the emergent light is emitted from the second imaging structure of the imaging device, the light source device and the polarization beam splitter are respectively located on two sides of the imaging device.

Optionally, when the incident light is incident from the second imaging structure of the imaging device, and the emergent light is emitted from the second imaging structure of the imaging device, the light source device and the polarization beam splitter are located on a same side of the imaging device.

Optionally, when the light source device and the polarization beam splitter are located on the same side of the imaging device, light emitted by the light source device is linearly polarized light, and a polarization direction of the linearly polarized light is the same as the direction of the fast axis or the slow axis of the second liquid crystal layer.

Optionally, the light source device may emit red light, green light, and blue light in a time sequence (namely, time division multiplexing). To be specific, the red light is first separately emitted, next the green light is separately emitted, and then the blue light is separately emitted. In this way, light in different colors is sequentially emitted.

Based on the foregoing embodiments, this embodiment specifically describes how the first controller determines the first drive signal and the second drive signal.

The first controller is specifically configured to determine the first drive signal and the second drive signal based on intensity of emergent light in an s-polarization state, intensity of emergent light in a p-polarization state, intensity of incident light, a polarization direction of the polarization beam splitter, the transmission direction of the first polarizer, and/or the transmission direction of the second polarizer.

Specifically, when the first imaging structure of the imaging device is the first liquid crystal structure, the second imaging structure of the imaging device is the second liquid crystal structure, and the first pixel electrode of the first liquid crystal structure is a transparent pixel electrode, the first controller establishes a first equation based on the intensity of the emergent light in the s-polarization state, the intensity of the incident light, the polarization direction of the polarization beam splitter, the transmission direction of the first polarizer, the transmission direction of the second polarizer, a deflection angle $\theta_1$ of the liquid crystal at the first liquid crystal layer, and a deflection angle $\theta_2$ of the liquid crystal at the second liquid crystal layer; establishes a second equation based on the intensity of the emergent light in the p-polarization state, the intensity of the incident light, the polarization direction of the polarization beam splitter, the transmission direction of the first polarizer, the transmission direction of the second polarizer, the deflection angle $\theta_1$ of the liquid crystal at the first liquid crystal layer, and the deflection angle $\theta_2$ of the liquid crystal at the second liquid crystal layer; and obtains $\theta_1$ and $\theta_2$ by solving the first equation and the second equation. There is a first correspondence between the first drive signal and the deflection angle $\theta_1$ of the liquid crystal at the first liquid crystal layer, and there is a second correspondence between the second drive signal and the deflection angle $\theta_2$ of the liquid crystal at the second liquid crystal layer. The first drive signal is determined based on the deflection angle $\theta_1$ of the liquid crystal at the first liquid crystal layer and the first correspondence, and the second drive signal is determined based on the deflection angle $\theta_2$ of the liquid crystal at the second liquid crystal layer and the second correspondence.

When the first imaging structure of the imaging device is the first liquid crystal structure, the second imaging structure of the imaging device is the second liquid crystal structure, and the first pixel electrode is a reflective pixel electrode, the first controller establishes a first equation based on the intensity of the emergent light in the s-polarization state, the intensity of the incident light, the polarization direction of the polarization beam splitter, the transmission direction of the first polarizer, a deflection angle $\theta_1$ of the liquid crystal at the first liquid crystal layer, and a deflection angle $\theta_2$ of the liquid crystal at the second liquid crystal layer; establishes a second equation based on the intensity of the emergent light in the p-polarization state, the intensity of the incident light, the polarization direction of the polarization beam splitter, the transmission direction of the first polarizer, the deflection angle $\theta_1$ of the liquid crystal at the first liquid crystal layer, and the deflection angle $\theta_2$ of the liquid crystal at the second liquid crystal layer; and obtains $\theta_1$ and $\theta_2$ by solving the first equation and the second equation. There is a first correspondence between the first drive signal and the deflection angle $\theta_1$ of the liquid crystal at the first liquid crystal layer, and there is a second correspondence between the second drive signal output by the first controller and the deflection angle $\theta_2$ of the liquid crystal at the second liquid crystal layer. The first drive signal is determined based on the deflection angle $\theta_1$ of the liquid crystal at the first liquid crystal layer and the first correspondence, and the second drive signal is determined based on the deflection angle $\theta_2$ of the liquid crystal at the second liquid crystal layer and the second correspondence.

When the first imaging structure of the imaging device is the organic light-emitting diode, and the second imaging structure of the imaging device is the liquid crystal structure, the first controller establishes a first equation based on the intensity of the emergent light in the s-polarization state, the polarization direction of the polarization beam splitter, an amplitude $A_{i1}$ of the light, and a deflection angle $\theta_2$ of the liquid crystal of the liquid crystal structure; establishes a second equation based on the intensity of the emergent light in the p-polarization state, the intensity of the incident light, the polarization direction of the polarization beam splitter, the amplitude $A_{i1}$ of the light, and the deflection angle $\theta_2$ of the liquid crystal at the liquid crystal layer; and obtains $I_1$ and $\theta_2$ by solving the first equation and the second equation. There is a first correspondence between the first drive signal and luminous intensity of a pixel of the organic light-emitting diode, and there is a second correspondence between the second drive signal and the deflection angle $\theta_2$ of the liquid crystal at the liquid crystal layer. The first drive signal is determined based on the luminous intensity $I_1$ of the pixel of the organic light-emitting diode and the first correspondence, and the second drive signal is determined based on the deflection angle $\theta_2$ of the liquid crystal at the liquid crystal layer and the second correspondence.

It should be understood that the intensity of the emergent light in the s-polarization state and the intensity of the emergent light in the p-polarization state are intensity required for imaging. The intensity may be known in advance. The intensity of the incident light, the polarization direction of the polarization beam splitter, the transmission direction of the first polarizer, and/or the transmission direction of the second polarizer depend/depends on the imaging device, and are/is also known parameters.

Based on the foregoing embodiments, the following further describes a process of determining the first drive signal and the second drive signal.

Figure 12:
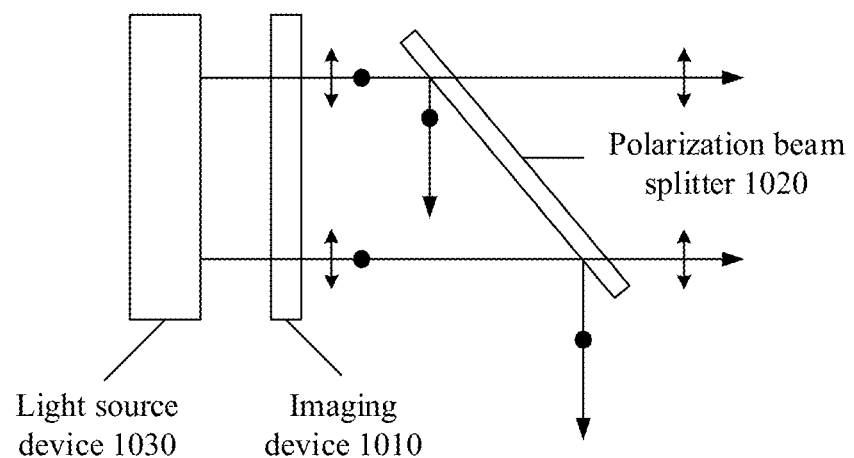
FIG. 12 is a schematic diagram of an optical path process of a display apparatus according to an embodiment of this application.

FIG. 12 is a schematic diagram of an optical path process of the display apparatus 1000. The imaging device 1010 of the display apparatus 1000 is the transmissive liquid crystal device 700. The light source device 1030 is a back light source. To be specific, light emitted by the light source device 1030 is vertically incident into the second polarizer 717 of the imaging device 700, and emergent light emitted from the liquid crystal device 700 carries information about the two images. The information about the images is respectively carried by light that is obtained through decomposition by the polarization beam splitter 1020 and that is in a p-polarization state and light that is obtained through decomposition by the polarization beam splitter 1020 and that is in an s-polarization state; and then transmitted to respective imaging or waveguide systems, to implement left-eye 3D imaging and right-eye 3D imaging.

The following specifically describes how the polarization beam splitter 1020 decomposes the emergent light to obtain the light in the p-polarization state and the light in the s-polarization state.

A relationship between intensity of the emergent light in the s-polarization state and each of the deflection angles of the two liquid crystal layers of the liquid crystal device 700 may be calculated based on a Jones matrix. It is assumed that an included angle between the incident light and an x axis is 135°, and intensity of the incident light is 1. After the incident light passes through the liquid crystal device 1010 and the polarization beam splitter 1020, a change of electric field energy of a light wave may be calculated according to Formula (1).

The intensity of the emergent light in the s-polarization state is calculated according to Formula (1):

$$E_{x_{out}}' = \frac{1}{2}\begin{bmatrix} 1 & 1 \\ 1 & 1 \end{bmatrix}\begin{bmatrix} 1 & 0 \\ 0 & e^{i\theta_2} \end{bmatrix}\frac{1}{2}\begin{bmatrix} 1 & 1 \\ 1 & 1 \end{bmatrix}\begin{bmatrix} 1 & 0 \\ 0 & e^{i\theta_1} \end{bmatrix}\begin{bmatrix} \cos 135° \\ \sin 135° \end{bmatrix} \quad (1)$$

$$= \frac{1}{4}\begin{bmatrix} 1 & e^{i\theta_2} \\ 1 & e^{i\theta_2} \end{bmatrix}\begin{bmatrix} 1 & 1 \\ 1 & 1 \end{bmatrix}\begin{bmatrix} 1 & 0 \\ 0 & e^{i\theta_1} \end{bmatrix}\begin{bmatrix} \cos 135° \\ \sin 135° \end{bmatrix}$$

$$= \frac{1}{4}\begin{bmatrix} 1+e^{i\theta_2} & 1+e^{i\theta_2} \\ 1+e^{i\theta_2} & 1+e^{i\theta_2} \end{bmatrix}\begin{bmatrix} 1 & 0 \\ 0 & e^{i\theta_1} \end{bmatrix}\begin{bmatrix} \cos 135° \\ \sin 135° \end{bmatrix}$$

$$= \frac{1}{4}\begin{bmatrix} 1+e^{i\theta_2} & (1+e^{i\theta_2})e^{i\theta_1} \\ 1+e^{i\theta_2} & (1+e^{i\theta_2})e^{i\theta_1} \end{bmatrix}\begin{bmatrix} \cos 135° \\ \sin 135° \end{bmatrix}$$

$$= \frac{1}{4}\begin{bmatrix} (1+e^{i\theta_2})\cos 135° + (e^{i\theta_1} + e^{i(\theta_1+\theta_2)})\sin 135° \\ (1+e^{i\theta_2})\cos 135° + (e^{i\theta_1} + e^{i(\theta_1+\theta_2)})\sin 135° \end{bmatrix}$$

Each device that converts a polarization state of light may be represented by using a 2×2 matrix, which is referred to as a Jones matrix corresponding to a polarization component. In Formula (1), $$\begin{bmatrix} \cos 135° \\ \sin 135° \end{bmatrix}$$

is a mathematical expression corresponding to the second polarizer 717, $$\begin{bmatrix} 1 & 0 \\ 0 & e^{i\theta_1} \end{bmatrix}$$

is a mathematical expression of a Jones matrix corresponding to the first liquid crystal layer 713, $$\frac{1}{2}\begin{bmatrix} 1 & 1 \\ 1 & 1 \end{bmatrix}$$

is a mathematical expression of a Jones matrix corresponding to the first polarizer 716, $$\begin{bmatrix} 1 & 0 \\ 0 & e^{i\theta_2} \end{bmatrix}$$

is a mathematical expression of a Jones matrix corresponding to the second liquid crystal layer 723, $$\frac{1}{2}\begin{bmatrix} 1 & 1 \\ 1 & 1 \end{bmatrix}$$

is a mathematical expression of a Jones matrix corresponding to the polarization beam splitter 1020, and $\theta_1$ and $\theta_2$ respectively represent the deflection angle of the liquid crystal at the first liquid crystal layer and the deflection angle of the liquid crystal at the second liquid crystal layer, and $E_{scout}{}'$ represents electric field energy of the light wave on the x axis after the incident light passes through the liquid crystal device 1010 and the polarization beam splitter 1020.

Beam intensity is defined as the square of the electric field energy of the light wave. Therefore, intensity of the emergent light in an x-axis direction is calculated according to Formula (2):

$$\begin{aligned} I_s = \ & |E_s|^2 = E_{sx}E_{sx}^* + E_{sy}E_{sy}^* \qquad (2) \\ = \ & 2 \cdot \frac{1}{4}[(1+e^{i\theta_2})\cos 135° + (e^{i\theta_1}+e^{i(\theta_1+\theta_2)})\sin 135°] \cdot \\ & \frac{1}{4}[(1+e^{-i\theta_2})\cos 135° + (e^{-i\theta_1}+e^{-i(\theta_1+\theta_2)})\sin 135°] \\ = \ & \frac{1}{8}[2(1+\cos\theta_2)\cos^2 135° + 2(1+\cos\theta_2)\sin^2 135° - \\ & 2(\cos\theta_1 + \cos\theta_1\cos\theta_2)] \\ = \ & \frac{1}{4}(1+\cos\theta_2 - \cos\theta_1 - \cos\theta_1\cos\theta_2) \end{aligned}$$

A relationship between intensity of the emergent light in the p-polarization state and each of the deflection angles of the two liquid crystal layers of the liquid crystal device 700 may be obtained in a similar manner. It is assumed that an included angle between the incident light and an x axis is 135°, and intensity of the incident light is 1. After the incident light passes through the liquid crystal device 1010 and the polarization beam splitter 1020, a change of electric field energy of a light wave may be calculated according to Formula (3).

$$\begin{aligned} E_{yout}{}' = & \frac{1}{2}\begin{bmatrix} 1 & -1 \\ -1 & 1 \end{bmatrix}\begin{bmatrix} 1 & 0 \\ 0 & e^{i\theta_2} \end{bmatrix}\frac{1}{2}\begin{bmatrix} 1 & 1 \\ 1 & 1 \end{bmatrix}\begin{bmatrix} 1 & 0 \\ 0 & e^{i\theta_1} \end{bmatrix}\begin{bmatrix} \cos 135° \\ \sin 135° \end{bmatrix} \qquad (3) \\ = & \frac{1}{4}\begin{bmatrix} 1 & -e^{i\theta_2} \\ -1 & e^{i\theta_2} \end{bmatrix}\begin{bmatrix} 1 & 1 \\ 1 & 1 \end{bmatrix}\begin{bmatrix} 1 & 0 \\ 0 & e^{i\theta_1} \end{bmatrix}\begin{bmatrix} \cos 135° \\ \sin 135° \end{bmatrix} \\ = & \frac{1}{4}\begin{bmatrix} 1-e^{i\theta_2} & 1-e^{i\theta_2} \\ -1+e^{i\theta_2} & -1+e^{i\theta_2} \end{bmatrix}\begin{bmatrix} 1 & 0 \\ 0 & e^{i\theta_1} \end{bmatrix}\begin{bmatrix} \cos 135° \\ \sin 135° \end{bmatrix} \\ = & \frac{1}{4}\begin{bmatrix} 1-e^{i\theta_2} & (1-e^{i\theta_2})e^{i\theta_1} \\ -1+e^{i\theta_2} & (-1+e^{i\theta_2})e^{i\theta_1} \end{bmatrix}\begin{bmatrix} \cos 135° \\ \sin 135° \end{bmatrix} \\ = & \frac{1}{4}\begin{bmatrix} (1-e^{i\theta_2})\cos 135° + (e^{i\theta_1}-e^{i(\theta_1+\theta_2)})\sin 135° \\ (-1+e^{i\theta_2})\cos 135° + (-e^{i\theta_1}+e^{i(\theta_1+\theta_2)})\sin 135° \end{bmatrix} \end{aligned}$$

Similarly, in Formula (3), $$\begin{bmatrix} \cos 135° \\ \sin 135° \end{bmatrix}$$

is a mathematical expression corresponding to the second polarizer 717, $$\begin{bmatrix} 1 & 0 \\ 0 & e^{i\theta_1} \end{bmatrix}$$

is a mathematical expression of a Jones matrix corresponding to the first liquid crystal layer 713, $$\frac{1}{2}\begin{bmatrix} 1 & 1 \\ 1 & 1 \end{bmatrix}$$

is a mathematical expression of a Jones matrix corresponding to the first polarizer 716, $$\begin{bmatrix} 1 & 0 \\ 0 & e^{i\theta_2} \end{bmatrix}$$

is a mathematical expression of a Jones matrix corresponding to the second liquid crystal layer 723, $$\frac{1}{2}\begin{bmatrix} 1 & 1 \\ 1 & 1 \end{bmatrix}$$

is a mathematical expression of a Jones matrix corresponding to the polarization beam splitter 1020, $\theta_1$ and $\theta_2$ respectively represent the deflection angle of the liquid crystal at the first liquid crystal layer and the deflection angle of the liquid crystal at the second liquid crystal layer, and $E_{yout}{}'$ represents electric field energy of the light wave on a y axis after the incident light passes through the liquid crystal device 1010 and the polarization beam splitter 1020.

Similarly, intensity of the emergent light in a y-axis direction is calculated according to Formula (4):

$$\begin{aligned} I_p = \ & |E_p|^2 = E_{px}E_{px}^* + E_{py}E_{py}^* \qquad (4) \\ = \ & 2 \cdot \frac{1}{4}[(1-e^{i\theta_2})\cos 135° + (e^{i\theta_1}-e^{i(\theta_1+\theta_2)})\sin 135°] \cdot \\ & \frac{1}{4}[(1-e^{-i\theta_2})\cos 135° + (e^{-i\theta_1}-e^{-i(\theta_1+\theta_2)})\sin 135°] \\ = \ & \frac{1}{8}[2(1-\cos\theta_2)\cos^2 135° + 2(1-\cos\theta_2)\sin^2 135° - \\ & 2(\cos\theta_1 - \cos\theta_1\cos\theta_2)] \\ = \ & \frac{1}{4}(1-\cos\theta_2 - \cos\theta_1 + \cos\theta_1\cos\theta_2) \end{aligned}$$

It should be understood that, in the foregoing formula, for ease of description, pixel coordinates are not carried in the corresponding deflection angles $\theta_1$ and $\theta_2$ of the liquid crystals. In an actual case, each pixel unit corresponds to a deflection angle of a liquid crystal corresponding to the pixel unit. A pixel unit is used as an example for description below.

Formula (2) and Formula (4) are combined and solved to obtain the following:

$$\cos\theta_{1ij} = 2(I_{sij} + I_{pij}) - 1 \quad (5)$$

$$\cos\theta_{2ij} = \frac{I_{sij} - I_{pij}}{I_{sij} + I_{pij}} \quad (6)$$

where i and j represent a pixel unit in a row i and a column j; $\cos\theta_{1ij}$ represents a deflection angle of a liquid crystal, corresponding to a pixel unit in a row i and a column j, at the first liquid crystal layer; $\cos\theta_{2ij}$ represents a deflection angle of a liquid crystal, corresponding to a pixel unit in a row i and a column j, at the second liquid crystal layer; $I_{sij}$ represents light intensity in a row i and a column j in the first image; and $I_{pij}$ represents light intensity in a row i and a column j in the second image.

After the deflection angle $\cos\theta_{1ij}$ of the liquid crystal at the first liquid crystal layer and the deflection angle $\cos\theta_{2ij}$ of the liquid crystal at the second liquid crystal layer are obtained, a first drive signal $V_{1ij}$ loaded for a pixel unit in a row i and a column j of the first pixel electrode may be obtained based on the first correspondence between the first drive signal and the deflection angle of the liquid crystal at the first imaging layer, and a second drive signal $V_{2ij}$ loaded for a pixel unit in a row i and a column j of the second pixel electrode may be obtained based on the second correspondence between the second drive signal and the deflection angle of the liquid crystal at the second imaging layer.

It should be understood that the intensity of the light in the s-polarization state may be used as the light intensity of the first image, and the intensity of the light in the p-polarization state may be used as the light intensity of the second image.

Figure 13:
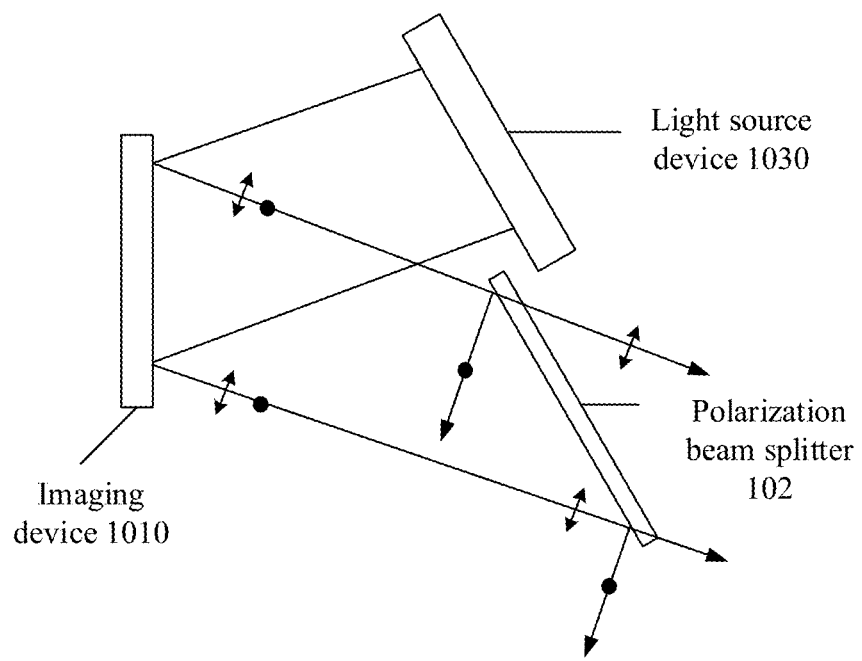
FIG. 13 is a schematic diagram of another optical path process of a display apparatus according to an embodiment of this application.

FIG. 13 is a schematic diagram of another optical path process of the display apparatus 1000. The imaging device 1010 of the display apparatus 1000 is the reflective liquid crystal device 600. The light source device 1030 is a front light source. Light emitted by the light source device 1030 is incident into the imaging device 600 from a surface of the second imaging structure 620 of the imaging device 600. After the imaging device 600 performs amplitude modulation and phase modulation on the incident light, emergent light obtained after the amplitude modulation and the phase modulation is emitted from the surface of the second imaging structure of the imaging device 600, and the emergent light carries information about the two images. The information about the images is respectively carried by light that is obtained through decomposition by the polarization beam splitter 1020 and that is in a p-polarization state and light that is obtained through decomposition by the polarization beam splitter 1020 and that is in an s-polarization state; and then transmitted to respective imaging or waveguide systems, to implement left-eye 3D imaging and right-eye 3D imaging.

Optionally, the light emitted by the light source device is linearly polarized light, and a polarization direction of the linearly polarized light is the same as a polarization direction of light along the fast axis or the slow axis of the second liquid crystal layer.

Specifically, because incident light with disordered polarization directions cannot be modulated at the liquid crystal layer, the light emitted by the light source device 1030 is the linearly polarized light, and the polarization direction of the linearly polarized light is the same as the polarization direction of the light along the fast axis or the slow axis of the second liquid crystal layer.

The following specifically describes how the polarization beam splitter 1020 decomposes the emergent light to obtain the light in the p-polarization state and the light in the s-polarization state.

A relationship between intensity of the emergent light in the s-polarization state and each of the deflection angles of the two liquid crystal layers of the imaging device 600 may be calculated based on a Jones matrix. It is assumed that an included angle between the incident light and an x axis is 0°, and intensity of the incident light is 1. After the incident light passes through the liquid crystal device 1010 and the polarization beam splitter 1020, a change of electric field energy of a light wave may be calculated according to Formula (7):

$$E_{x_{out}}' = \frac{1}{2}\begin{bmatrix} 1 & 1 \\ 1 & 1 \end{bmatrix}\begin{bmatrix} 1 & 0 \\ 0 & e^{i\theta_2} \end{bmatrix}\frac{1}{2}\begin{bmatrix} 1 & 1 \\ 1 & 1 \end{bmatrix}\begin{bmatrix} 1 & 0 \\ 0 & e^{i\theta_1} \end{bmatrix} \quad (7)$$

$$\frac{1}{2}\begin{bmatrix} 1 & 1 \\ 1 & 1 \end{bmatrix}\begin{bmatrix} 1 & 0 \\ 0 & e^{i\theta_2} \end{bmatrix}\begin{bmatrix} 1 \\ 0 \end{bmatrix}$$

$$= \frac{1}{8}\begin{bmatrix} 1 + e^{i\theta_1} + e^{i\theta_2} + e^{i(\theta_1+\theta_2)} \\ 1 + e^{i\theta_1} + e^{i\theta_2} + e^{i(\theta_1+\theta_2)} \end{bmatrix}$$

where $\theta_1$ and $\theta_2$ respectively represent the deflection angle of the liquid crystal at the first liquid crystal layer and the deflection angle of the liquid crystal at the second liquid crystal layer; and in Formula (7), $$\begin{bmatrix} 1 & 0 \\ 0 & e^{i\theta_1} \end{bmatrix}$$

is a mathematical expression of a Jones matrix corresponding to the first liquid crystal layer 613, and $$\frac{1}{2}\begin{bmatrix} 1 & 1 \\ 1 & 1 \end{bmatrix}$$

is a mathematical expression of a Jones matrix corresponding to the first polarizer 616, $$\begin{bmatrix} 1 & 0 \\ 0 & e^{i\theta_2} \end{bmatrix}$$

is a mathematical expression of a Jones matrix corresponding to the second liquid crystal layer 623, $$\frac{1}{2}\begin{bmatrix} 1 & 1 \\ 1 & 1 \end{bmatrix}$$

is a mathematical expression of a Jones matrix corresponding to the polarization beam splitter 1020, and $E_{x_{out}}'$ represents electric field energy of the light wave on the x axis after the incident light passes through the liquid crystal device 1010 and the polarization beam splitter 1020.

Intensity of the emergent light in an x-axis direction is calculated according to Formula (8):

$$I_s = |E_s|^2 = E_{sx}E_{sx}^* + E_{sy}E_{sy}^* \quad (8)$$

$$= \frac{1}{8}(1 + \cos\theta_1 + \cos\theta_2 + \cos\theta_1\cos\theta_2)$$

A relationship between intensity of the emergent light in the p-polarization state and each of the deflection angles of the two liquid crystal layers of the imaging device 600 may be obtained in a similar manner. It is assumed that an included angle between the incident light and an x axis is 0°, and intensity of the incident light is 1. After the incident light passes through the liquid crystal device 1010 and the polarization beam splitter 1020, a change of electric field energy of a light wave may be calculated according to Formula (9):

$$E_{y_{out}}' = \frac{1}{2}\begin{bmatrix}1 & -1\\ -1 & 1\end{bmatrix}\begin{bmatrix}1 & 0\\ 0 & e^{i\theta_2}\end{bmatrix}\frac{1}{2}\begin{bmatrix}1 & 1\\ 1 & 1\end{bmatrix}\begin{bmatrix}1 & 0\\ 0 & e^{i\theta_1}\end{bmatrix} \quad (9)$$

$$\frac{1}{2}\begin{bmatrix}1 & 1\\ 1 & 1\end{bmatrix}\begin{bmatrix}1 & 0\\ 0 & e^{i\theta_2}\end{bmatrix}\begin{bmatrix}1\\ 0\end{bmatrix}$$

$$= \frac{1}{8}\begin{bmatrix}1 + e^{i\theta_1} - e^{i\theta_2} - e^{i(\theta_1+\theta_2)}\\ -1 - e^{i\theta_1} + e^{i\theta_2} + e^{i(\theta_1+\theta_2)}\end{bmatrix}$$

where $\theta_1$ and $\theta_2$ respectively represent voltage phases loaded onto the first liquid crystal layer and the second liquid crystal layer; and in Formula (9), $$\begin{bmatrix}1 & 0\\ 0 & e^{i\theta_1}\end{bmatrix}$$

is a mathematical expression of a Jones matrix corresponding to the first liquid crystal layer 613, $$\frac{1}{2}\begin{bmatrix}1 & 1\\ 1 & 1\end{bmatrix}$$

is a mathematical expression of a Jones matrix corresponding to the first polarizer 616, $$\begin{bmatrix}1 & 0\\ 0 & e^{i\theta_2}\end{bmatrix}$$

is a mathematical expression of a Jones matrix corresponding to the second liquid crystal layer 623, and $$\frac{1}{2}\begin{bmatrix}1 & 1\\ 1 & 1\end{bmatrix}$$

is a mathematical expression of a Jones matrix corresponding to the polarization beam splitter 1020.

Similarly, intensity of the emergent light in a y-axis direction is calculated according to Formula (10):

$$I_s = |E_s|^2 = E_{sx}E_{sx}^* + E_{sy}E_{sy}^* \quad (10)$$

$$= \frac{1}{8}(1 + \cos\theta_1 - \cos\theta_2 - \cos\theta_1\cos\theta_2)$$

It should be understood that, in the foregoing formula, for ease of description, pixel coordinates are not carried in the corresponding deflection angles $\theta_1$ and $\theta_2$ of the liquid crystals. In an actual case, each pixel unit corresponds to a deflection angle of a liquid crystal corresponding to the pixel unit. A pixel unit is used as an example for description below.

Formula (8) and Formula (10) are combined and solved to obtain the following:

$$\cos\theta_{1ij} = 4(I_{sij} + I_{pij}) - 1 \quad (11)$$

$$\cos\theta_{2ij} = \frac{I_{sij} - I_{pij}}{I_{sij} + I_{pij}} \quad (12)$$

where i and j represent a pixel unit in a row i and a column j; $\cos\theta_{1ij}$ represents a phase of a liquid crystal, corresponding to a pixel unit in a row i and a column j, at the first liquid crystal layer; $\cos\theta_{2ij}$ represents a phase of a liquid crystal, corresponding to a pixel unit in a row i and a column j, at the second liquid crystal layer; $I_{sij}$ represents light intensity in a row i and a column j in the first image; and $I_{pij}$ represents light intensity in a row i and a column j in the second image.

After the deflection angle $\cos\theta_{1ij}$ of the liquid crystal at the first liquid crystal layer and the deflection angle $\cos\theta_{2ij}$ of the liquid crystal at the second liquid crystal layer are obtained, a first drive signal $V_{1ij}$ loaded for a pixel unit in a row i and a column j of the first pixel electrode may be obtained based on the first correspondence between the first drive signal and the deflection angle of the liquid crystal at the first imaging layer, and a second drive signal $V_{2ij}$ loaded for a pixel unit in a row i and a column j of the second pixel electrode may be obtained based on the second correspondence between the second drive signal and the deflection angle of the liquid crystal at the second imaging layer.

Figure 14:
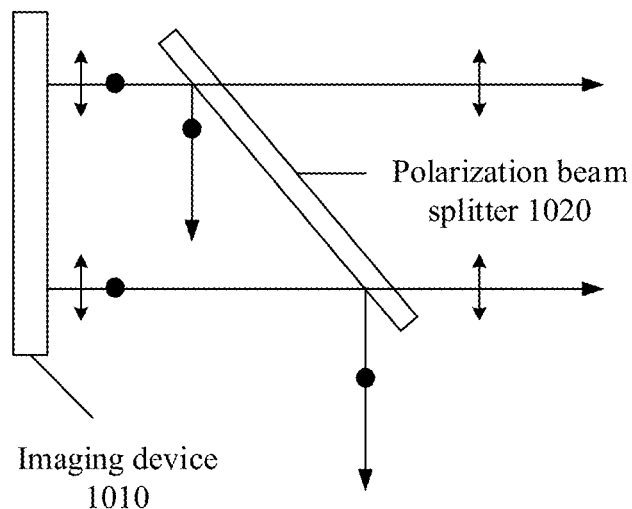
FIG. 14 is a schematic diagram of another optical path process of a display apparatus according to an embodiment of this application.

FIG. 14 is a schematic diagram of another optical path process of the display apparatus 1000. The imaging device 1010 of the display apparatus 1000 is the imaging device 800. In the imaging device 800, the first imaging structure 810 is the organic light-emitting diode, and the second imaging structure 820 is the liquid crystal structure. The organic light-emitting diode is a self-luminous component, and therefore no light source is required in the display apparatus. An included angle between a direction of a fast axis or a slow axis of the second liquid crystal layer and a transmission direction of the polarizer of the organic light-emitting diode is 45°. After the imaging device 800 performs amplitude modulation and phase modulation on light, emergent light obtained after the amplitude modulation and the phase modulation is emitted from a surface of the second imaging structure of the imaging device 800, and the emergent light carries information about the two images. The information about the images is respectively carried by light that is obtained through decomposition by the polarization beam splitter 1020 and that is in a p-polarization state and light that is obtained through decomposition by the polarization beam splitter 1020 and that is in an s-polarization state; and then transmitted to respective imaging or waveguide systems, to implement left-eye 3D imaging and right-eye 3D imaging.

The following specifically describes how the polarization beam splitter 1020 decomposes the emergent light to obtain the light in the p-polarization state and the light in the s-polarization state.

A relationship between the deflection angle of the liquid crystal and both intensity of the emergent light in the s-polarization state and luminous intensity of a pixel of the organic light-emitting diode of the imaging device 800 may be calculated based on a Jones matrix. It is assumed that an included angle between the incident light and an x axis is 0°, and intensity of the incident light is 1. After the incident light passes through the liquid crystal device 1010 and the polarization beam splitter 1020, a change of electric field energy of a light wave may be calculated according to Formula (13):

$$E'_{x_{out}} = \frac{1}{2}\begin{bmatrix} 1 & 1 \\ 1 & 1 \end{bmatrix}\begin{bmatrix} 1 & 0 \\ 0 & e^{i\theta_2} \end{bmatrix}\begin{bmatrix} \frac{\sqrt{2}}{2}A_{i1} \\ \frac{\sqrt{2}}{2}A_{i1} \end{bmatrix} = \tag{13}$$

$$\frac{\sqrt{2}}{4}\begin{bmatrix} 1 & e^{i\theta_2} \\ 1 & e^{i\theta_2} \end{bmatrix}\begin{bmatrix} A_{i1} \\ A_{i1} \end{bmatrix} = \frac{\sqrt{2}}{4}A_{i1}\begin{bmatrix} 1+e^{i\theta_2} \\ 1+e^{i\theta_2} \end{bmatrix}$$

where $A_{i1}$ represents an amplitude of the light, and $\theta_2$ represents the deflection angle of the liquid crystal at the liquid crystal layer; and in Formula (13), $$\begin{bmatrix} \frac{\sqrt{2}}{2}A_{i1} \\ \frac{\sqrt{2}}{2}A_{i1} \end{bmatrix}$$

is a mathematical expression of a Jones matrix corresponding to the organic light-emitting diode 810, $$\begin{bmatrix} 1 & 0 \\ 0 & e^{i\theta_2} \end{bmatrix}$$

is a mathematical expression of a Jones matrix corresponding to the liquid crystal layer 823, $$\frac{1}{2}\begin{bmatrix} 1 & 1 \\ 1 & 1 \end{bmatrix}$$

is a mathematical expression of a Jones matrix corresponding to the polarization beam splitter 1020, and $E_{xout}'$ represents electric field energy of the light wave on the x axis after the incident light passes through the liquid crystal device 1010 and the polarization beam splitter 1020.

Intensity of the emergent light in an x-axis direction is calculated according to Formula (8):

$$I_s = |E_s|^2 = E_{sx}E_{sx}^* + E_{sy}E_{sy}^* = \frac{1}{2}I_{i1}(1+\cos\theta_2) \tag{14}$$

A relationship between the deflection angle of the liquid crystal and both intensity of the emergent light in the p-polarization state and luminous intensity of a pixel of the organic light-emitting diode of the imaging device 800 may be obtained in a similar manner. It is assumed that an included angle between the incident light and an x axis is 0°, and intensity of the incident light is 1. After the incident light passes through the imaging device 1010 and the polarization beam splitter 1020, a change of electric field energy of a light wave may be calculated according to Formula (15):

$$E'_{x_{out}} = \frac{1}{2}\begin{bmatrix} 1 & -1 \\ -1 & 1 \end{bmatrix}\begin{bmatrix} 1 & 0 \\ 0 & e^{i\theta_2} \end{bmatrix}\begin{bmatrix} \frac{\sqrt{2}}{2}A_{i1} \\ \frac{\sqrt{2}}{2}A_{i1} \end{bmatrix} = \tag{15}$$

$$\frac{\sqrt{2}}{4}\begin{bmatrix} 1 & e^{i\theta_2} \\ 1 & e^{i\theta_2} \end{bmatrix}\begin{bmatrix} A_{i1} \\ A_{i1} \end{bmatrix} = \frac{\sqrt{2}}{4}A_{i1}\begin{bmatrix} 1-e^{i\theta_2} \\ -1+e^{i\theta_2} \end{bmatrix}$$

where $A_{i1}$ represents an amplitude of the light, and $\theta_2$ represents the deflection angle of the liquid crystal at the liquid crystal layer; and in Formula (15), $$\begin{bmatrix} \frac{\sqrt{2}}{2}A_{i1} \\ \frac{\sqrt{2}}{2}A_{i1} \end{bmatrix}$$

is a mathematical expression of a Jones matrix corresponding to the first liquid crystal layer 810, $$\begin{bmatrix} 1 & 0 \\ 0 & e^{i\theta_2} \end{bmatrix}$$

is a mathematical expression of a Jones matrix corresponding to the second liquid crystal layer 823, and $$\frac{1}{2}\begin{bmatrix} 1 & 1 \\ 1 & 1 \end{bmatrix}$$

is a mathematical expression of a Jones matrix corresponding to the polarization beam splitter 1020.

Similarly, intensity of the emergent light in a y-axis direction is calculated according to Formula (16):

$$I_s = |E_s|^2 = E_{sx}E_{sx}^* + E_{sy}E_{sy}^* = \frac{1}{2}I_{i1}(1-\cos\theta_2) \tag{16}$$

It should be understood that, in the foregoing formula, for ease of description, pixel coordinates are not carried in luminous intensity $I_1$ of a corresponding pixel unit and the deflection angle $\theta_2$ of the liquid crystal. In an actual case, each pixel unit corresponds to a respective luminous intensity and a respective deflection angle of a liquid crystal. A pixel unit is used as an example for description below.

Formula (14) and Formula (16) are combined and solved to obtain the following:

$$I_{1ij} = I_{sij} + I_{pij} \tag{17}$$

-continued $$\cos\theta_{2ij} = \frac{I_{sij} - I_{pij}}{I_{sij} + I_{pij}} \quad (18)$$

where i and j represent a pixel unit in a row i and a column j; $I_{1ij}$ represents luminous intensity of a pixel of a pixel unit in a row i and a column j of the first organic light-emitting diode; $\cos\theta_{2ij}$ represents a deflection phase of a liquid crystal, corresponding to a pixel unit in a row i and a column j, at the first liquid crystal layer; $I_{sij}$ represents light intensity in a row i and a column j in the first image; and $I_{pij}$ represents light intensity in a row i and a column j in the second image.

After the luminous intensity of the pixel of the pixel unit in the row i and the column j of the first organic light-emitting diode and the deflection angle $\cos\theta_{2ij}$ of the liquid crystal at the second liquid crystal layer are obtained, a first drive signal $i_{1ij}$ loaded for a pixel unit in a row i and a column j of the first pixel electrode may be obtained based on the first correspondence between the first drive signal and the luminous intensity $I_{1ij}$ of the pixel of the organic light-emitting diode, and a second drive signal $V_{2ij}$ loaded for a pixel unit in a row i and a column j of the second pixel electrode may be obtained based on the second correspondence between the second drive signal and the deflection angle of the liquid crystal of the second imaging structure.

Figure 15:
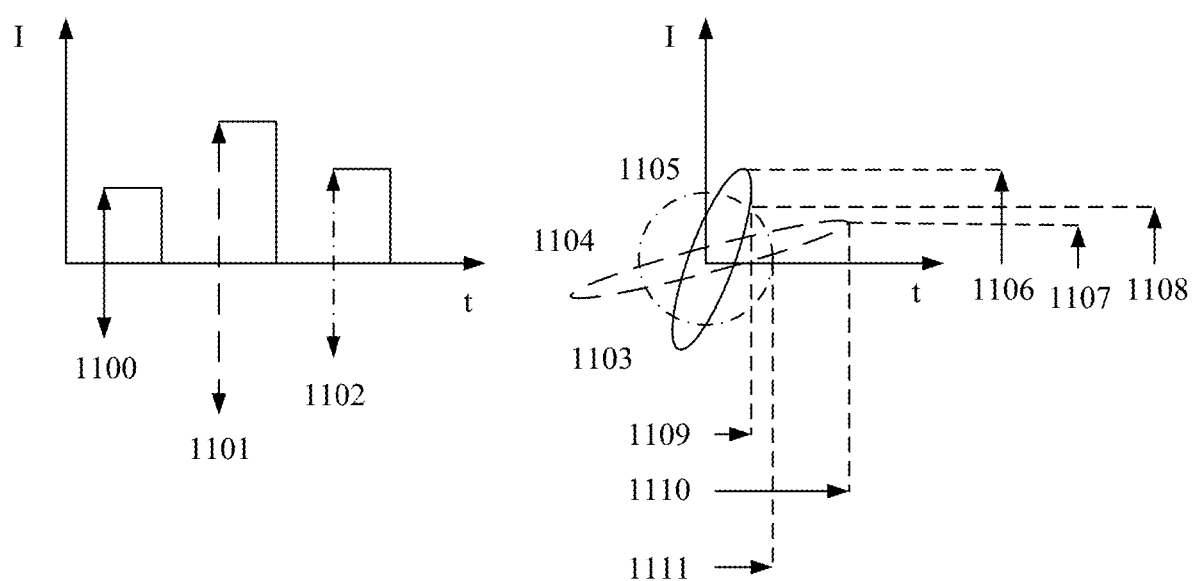
FIG. 15 is a schematic diagram of a procedure for performing amplitude modulation and phase modulation on incident light by a display apparatus according to an embodiment of this application.

Based on the foregoing embodiments, this embodiment specifically describes, with reference to a schematic diagram of an optical path process shown in FIG. 15, amplitude modulation and phase modulation that are performed on a light signal by the display apparatus provided in this embodiment.

When passing through the first imaging structure, the light signal is modulated to incident light 1100, 1101, and 1102 with different intensity, and the modulated incident light is p-polarized light. Then, the modulated incident light enters the second imaging structure. The second imaging structure performs phase modulation on the modulated incident light to obtain polarized light in different polarization states, for example, elliptically polarized light 1103, elliptically polarized light 1104, and circularly polarized light 1105. The polarized light in the different polarization states is decomposed by the polarization beam splitter 1020 into, for example, p-polarized light 1106, 1107, and 1108, and s-polarized light 1109, 1110, and 1111.

It should be understood that the polarized light that is modulated by the second imaging structure and that is in the different polarization states may have a plurality of forms. The polarization states in FIG. 15 are merely used as an example, and constitute no limitation herein.

Optionally, when the first imaging structure is the first liquid crystal structure, the light source device of the display apparatus emits red light, green light, and blue light in a time sequence.

The light source may emit red, green, and blue RGB signals in a time sequence. The RGB signals in different time sequences are incident into the first liquid crystal structure, and are modulated into a red R signal (for example, 1100 in FIG. 15), a green G signal (for example, 1101 in FIG. 15), and a blue G signal (for example, 1102 in FIG. 15) with different strength. Then, the red R signal, the green G signal, and the blue G signal separately enter the second liquid crystal structure. The second liquid crystal structure performs phase modulation on the red R signal, the green G signal, and the blue G signal, to obtain polarized light in different polarization states, for example, red elliptically polarized light 1103, green elliptically polarized light 1104, and blue circularly polarized light 1105, where the polarized light in the different polarization states is not limited to a combination in the figure, and polarized light in various polarization states and with various colors may be randomly combined. Finally, the polarization beam splitter 1020 decomposes the polarized light into p-polarized RGB signals: a p-polarized R signal 1106, a p-polarized G signal 1107, and a p-polarized B signal 1108, and s-polarized RGB signals: an s-polarized R signal 1109, an s-polarized G signal 1110, and an s-polarized B signal 1111. All of the emergent light with a single color can be controlled independently, to output two independent color pictures.

It should be understood that light in different time sequences may have different light intensity requirements.

Figure 16:
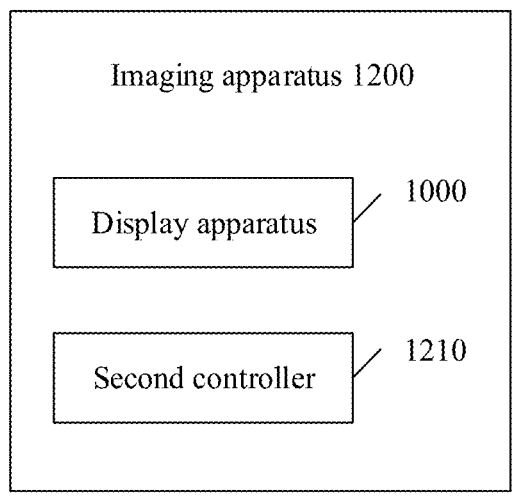
FIG. 16 is a schematic block diagram of an imaging apparatus according to an embodiment of this application.

Based on the foregoing embodiments, FIG. 16 is a schematic block diagram of an imaging apparatus according to an embodiment of this application. As shown in FIG. 16, the imaging apparatus 1200 includes a second controller 1210 and the display apparatus 1000 (it is assumed that the display apparatus includes a first controller). If the display apparatus does not include a first controller, in this embodiment, the imaging apparatus may further include a first controller. The second controller 1210 is configured to send a voltage signal to the first controller (which may be located inside the display apparatus or may exist independently), where the voltage signal carries pixel information of a first image and pixel information of a second image.

The second controller is the main control chip 310 shown in FIG. 3. The second controller receives image information according to a serial port protocol, and converts the input image information into a video signal (for example, a video signal such as an HDPI signal, an MIPI signal, an RGB signal, or an LVDS).

Optionally, the imaging apparatus may be an augmented reality (AR) device, a virtual reality (VR) device, a three dimensional (3D) television, a projector, a 3D game device, or the like.

Figure 17:
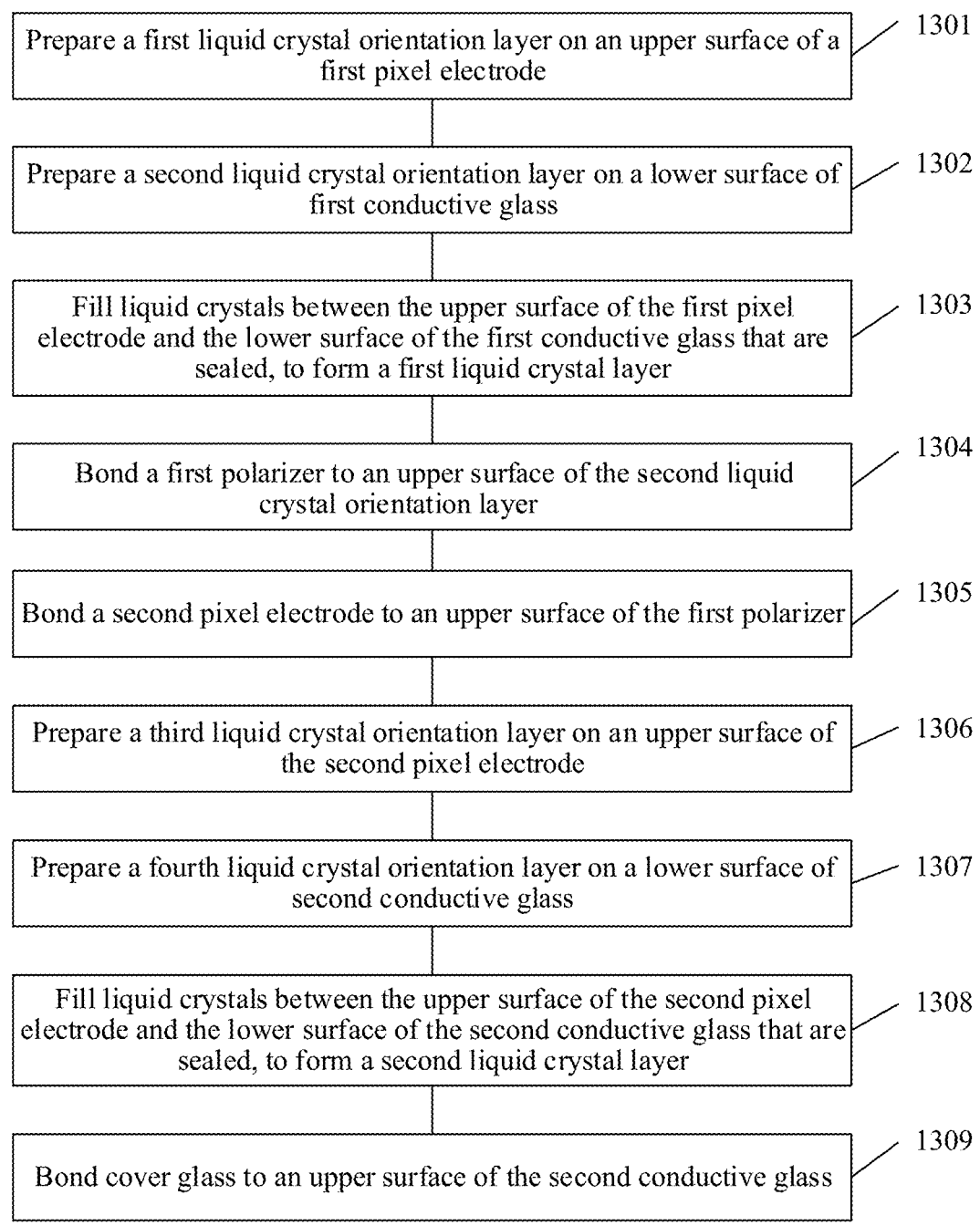
FIG. 17 is a schematic flowchart of a liquid crystal device preparation method according to an embodiment of this application.

Based on the foregoing embodiments, as shown in FIG. 17, this embodiment provides an imaging device preparation method 1300, including the following operations:

1301: Prepare a first liquid crystal orientation layer on an upper surface of a first pixel electrode.

1302: Prepare a second liquid crystal orientation layer on a lower surface of first conductive glass.

1303: Fill liquid crystals between the upper surface of the first pixel electrode and the lower surface of the first conductive glass that are sealed, to form a first liquid crystal layer.

1304: Bond a first polarizer to an upper surface of the second liquid crystal orientation layer.

1305: Bond a second pixel electrode to an upper surface of the first polarizer.

1306: Prepare a third liquid crystal orientation layer on an upper surface of the second pixel electrode.

1307: Prepare a fourth liquid crystal orientation layer on a lower surface of second conductive glass.

1308: Fill liquid crystals between the upper surface of the second pixel electrode and the lower surface of the second conductive glass that are sealed, to form a second liquid crystal layer.

1309: Bond cover glass to an upper surface of the second conductive glass.

Optionally, an included angle between a polarization direction of light along a fast axis or a slow axis of the second liquid crystal layer and a polarization direction of light transmitted through the first polarizer is 45°.

Optionally, the polarization direction of the light along the fast axis or the slow axis of the second liquid crystal layer is the same as a polarization direction of light along a fast axis or a slow axis of the first liquid crystal layer.

Optionally, the first pixel electrode is a reflective pixel electrode.

Optionally, the method further includes: bonding a second polarizer to a lower surface of the first pixel electrode, where the first pixel electrode is a transparent pixel electrode.

Optionally, an included angle between the polarization direction of the light transmitted through the first polarizer and a polarization direction of light transmitted through the second polarizer is 90°.

It should be understood that the numbers 1301 to 1309 are merely used for ease of description, and do not represent an execution sequence. For a preparation process in the method 1300, refer to a corresponding prior approach for a preparation process.

Figure 18:
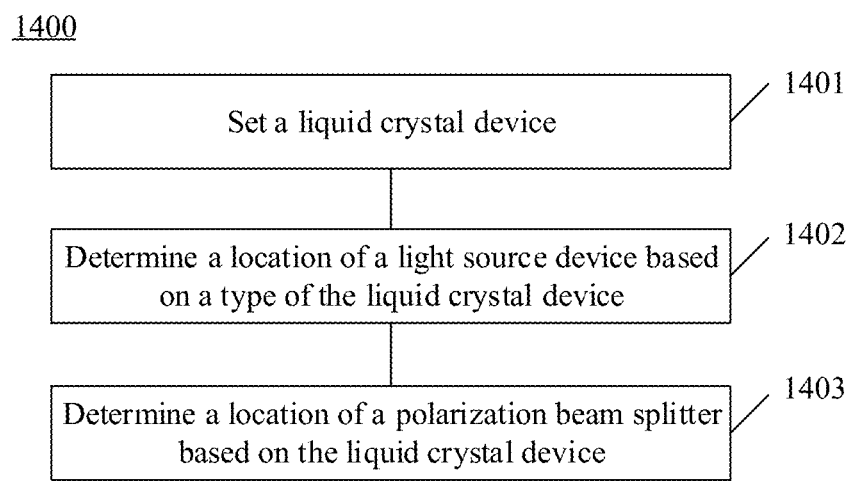
FIG. 18 is a schematic flowchart of a display apparatus preparation method according to an embodiment of this application.

Based on the foregoing embodiments, as shown in FIG. 18, this embodiment provides a display apparatus preparation method 1400, including the following operations:

1401: Set the liquid crystal device.

1402: Determine a location of a light source device based on a type of the liquid crystal device.

1403: Determine a location of a polarization beam splitter based on the liquid crystal device.

Optionally, when the liquid crystal device is a transmissive liquid crystal device, the light source device is located behind the liquid crystal device. In other words, the light source device is a back light source device. For a specific location structure between the liquid crystal device and the light source device, refer to a location structure between the light source device 1030 and the imaging device 1010 that are shown in FIG. 10.

Optionally, when the liquid crystal device is a reflective liquid crystal device, the light source device is located in front of the liquid crystal device. For a specific location structure between the liquid crystal device and the light source device, refer to a location structure between the light source device 1030 and the imaging device 1010 that are shown in FIG. 10.

Optionally, a polarization direction of the light that is obtained through decomposition by the polarization beam splitter and that is in the s-polarization state is the same as the polarization direction of the second polarizer of the liquid crystal device.

Specifically, for a method for setting the polarization direction of the light that is obtained through decomposition by the polarization beam splitter and that is in the s-polarization state, to be the same as the polarization direction of the second polarizer of the liquid crystal device, refer to related descriptions of the display apparatus in the foregoing embodiments.

A person skilled in the art may clearly understand that, for the purpose of convenient and brief description, for a detailed working process of the foregoing system, apparatus, and unit, refer to a corresponding process in the foregoing method embodiments. Details are not described herein.

In the several embodiments provided in this application, it should be understood that the disclosed system, apparatus, and method may be implemented in other manners. For example, the described apparatus embodiment is merely an example. For example, division into the units is merely logical function division and may be other division in an actual implementation. For example, a plurality of units or components may be combined or integrated into another system, or some features may be ignored or not performed.

The units described as separate parts may or may not be physically separate, and parts displayed as units may or may not be physical units, may be located in one position, or may be distributed on a plurality of network units. Some or all of the units may be selected based on actual requirements to achieve the objectives of the solutions of the embodiments.

In addition, functional units in the embodiments of this application may be integrated into one processing unit, or each of the units may exist alone physically, or two or more units are integrated into one unit.

When the functions are implemented in a form of a software functional unit and sold or used as an independent product, the functions may be stored in a computer-readable storage medium. For example, the processor in this application is configured to control a voltage loaded onto the first pixel electrode, to control the deflection angle of the liquid crystal at the first liquid crystal layer and change a phase of the incident light. When the phase-changed incident light passes through the first polarizer, light intensity of the incident light is reduced. The processor is further configured to control a voltage loaded onto the second pixel electrode, to control the deflection angle of the liquid crystal at the second liquid crystal layer and change a phase of the incident light whose light intensity is reduced. The processor may be stored in a computer-readable storage medium, for example, in a form of a chip. Based on such an understanding, the technical solutions of this application essentially, or the part contributing to the prior art, or some of the technical solutions may be implemented in a form of a software product. The computer software product is stored in a storage medium, and includes several instructions for instructing a computer device (which may be a personal computer, a server, a network device, or the like) to perform all or some of the steps of the methods described in the embodiments of this application. The foregoing storage medium includes: any medium that can store program code, such as a USB flash drive, a removable hard disk, a read-only memory (ROM), a random access memory (RAM), a magnetic disk, or an optical disc.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. An imaging device, comprising:
a first imaging structure and a second imaging structure that are respectively and sequentially stacked from bottom to top, wherein
the first imaging structure is configured to: perform amplitude modulation on a light signal based on a first drive signal, and output amplitude-modulated light, wherein the amplitude-modulated light carries pixel information of a first image and pixel information of a second image, and the first drive signal is determined based on light intensity of the first image and light intensity of the second image; and
the second imaging structure is configured to perform phase modulation on the amplitude-modulated light based on a second drive signal, wherein phase-modulated light is decomposed into light having two polarization components, wherein the light having the two polarization components is respectively used when forming the first image and the second image, and the second drive signal is determined based on the light intensity of the first image and the light intensity of the second image.

2. The imaging device according to claim 1, wherein the first imaging structure is a first liquid crystal structure, and the first liquid crystal structure comprises a first pixel electrode, a first orientation layer, a first liquid crystal layer, a second orientation layer, first conductive glass, and a first polarizer that are respectively and sequentially stacked from bottom to top;

the second imaging structure is a second liquid crystal structure, and the second liquid crystal structure comprises a second pixel electrode, a third orientation layer, a second liquid crystal layer, a fourth orientation layer, and second conductive glass that are respectively and sequentially stacked from bottom to top;

the first drive signal and the second drive signal are voltage signals;

the first pixel electrode and the first conductive glass are configured to: mutually cooperate to apply the first drive signal to the first liquid crystal layer, and control a deflection angle of a liquid crystal at the first liquid crystal layer with the cooperation of the first orientation layer and the second orientation layer, wherein light passing through liquid crystals with different deflection angles has different polarization directions; and the first polarizer is configured to attenuate, to different degrees, intensity of light that passes through the first liquid crystal layer and that has different polarization directions, to perform amplitude modulation on incident light that is used when displaying the first image and the second image; and the second pixel electrode and the second conductive glass are configured to: mutually cooperate to apply the second drive signal to the second liquid crystal layer, and control a deflection angle of a liquid crystal at the second liquid crystal layer with the cooperation of the third orientation layer and the fourth orientation layer, to perform phase modulation on light output from the first liquid crystal structure.

3. The imaging device according to claim 2, wherein an included angle between a direction of a fast axis or a slow axis of the second liquid crystal layer and a transmission direction of the first polarizer is 45°, and the direction of the fast axis or the slow axis of the second liquid crystal layer is the same as a direction of a fast axis or a slow axis of the first liquid crystal layer.

4. The imaging device according to claim 3, wherein the first pixel electrode is a reflective pixel electrode, and the incident light is incident from the second conductive glass of the second liquid crystal structure, reflected by the reflective pixel electrode, and then emitted from the second conductive glass.

5. The imaging device according to claim 3, wherein a polarization direction of the incident light is the same as the direction of the fast axis or the slow axis of the second liquid crystal layer.

6. The imaging device according to claim 2, further comprising:
a first correspondence between the first drive signal and the deflection angle of the liquid crystal at the first liquid crystal layer; and
a second correspondence between the second drive signal and the deflection angle of the liquid crystal at the second liquid crystal layer,
wherein the first drive signal is determined based on the deflection angle of the liquid crystal at the first liquid crystal layer and the first correspondence, and the second drive signal is determined based on the deflection angle of the liquid crystal at the second liquid crystal layer and the second correspondence.

7. The imaging device according to claim 6, wherein the deflection angle of the liquid crystal at the first liquid crystal layer is determined according to Formula (1), and the deflection angle of the liquid crystal at the second liquid crystal layer is determined according to Formula (2):

$$\cos\theta_{1ij} = 4(I_{sij} + I_{pij}) - 1 \tag{1}$$

$$\cos\theta_{2ij} = \frac{I_{sij} - I_{pij}}{I_{sij} + I_{pij}} \tag{2}$$

wherein in the formulas, i and j represent a pixel unit in a row i and a column j; $\cos\theta_{1ij}$ represents a deflection angle of a liquid crystal, corresponding to a pixel unit in a row i and a column j, at the first liquid crystal layer; $\cos\theta_{2ij}$ represents a deflection angle of a liquid crystal, corresponding to a pixel unit in a row i and a column j, at the second liquid crystal layer; $I_{sij}$ represents light intensity in a row i and a column j in the first image; and $I_{pij}$ represents light intensity in a row i and a column j in the second image.

8. The imaging device according to claim 2, wherein the first liquid crystal structure further comprises a second polarizer, an upper surface of the second polarizer is bonded to a lower surface of the first pixel electrode, the first pixel electrode is a transparent pixel electrode, the incident light is incident from the second polarizer and emitted from the second conductive glass of the second liquid crystal structure, and an included angle between a transmission direction of the first polarizer and a transmission direction of the second polarizer is 90°.

9. The imaging device according to claim 8, wherein a direction of the incident light and a direction of a fast axis or a slow axis of the first liquid crystal layer form an angle of 45°.

10. The imaging device according to claim 8, further comprising:
a first correspondence between the first drive signal and the deflection angle of the liquid crystal at the first liquid crystal layer; and
a second correspondence between the second drive signal and the deflection angle of the liquid crystal at the second liquid crystal layer,
wherein the first drive signal is determined based on the deflection angle of the liquid crystal at the first liquid crystal layer and the first correspondence, and the second drive signal is determined based on the deflection angle of the liquid crystal at the second liquid crystal layer and the second correspondence.

11. The imaging device according to claim 10, wherein the deflection angle of the liquid crystal at the first liquid crystal layer is determined according to Formula (3), and the deflection angle of the liquid crystal at the second liquid crystal layer is determined according to Formula (4):

$$\cos\theta_{1ij} = 2(I_{sij} + I_{pij}) - 1 \tag{3}$$

$$\cos\theta_{2ij} = \frac{I_{sij} - I_{pij}}{I_{sij} + I_{pij}} \tag{4}$$

wherein in the formulas, i and j represent a pixel unit in a row i and a column j; cos $\theta_{1ij}$ represents a deflection angle of a liquid crystal, corresponding to a pixel unit in a row i and a column j, at the first liquid crystal layer; cos $\theta_{2ij}$ represents a deflection angle of a liquid crystal, corresponding to a pixel unit in a row i and a column j, at the second liquid crystal layer; $I_{sij}$ represents light intensity in a row i and a column j in the first image; and $I_{pij}$ represents light intensity in a row i and a column j in the second image.

12. The imaging device according to claim 1, wherein a pixel size and an arrangement of a first pixel electrode are the same as a pixel size and an arrangement of a second pixel electrode, pixels of the first pixel electrode are a plurality of independent circuits onto which the first drive signal is loaded, and pixels of the second pixel electrode are a plurality of independent circuits onto which the second drive signal is loaded.

13. The imaging device according to claim 1, wherein the first imaging structure is an organic light-emitting diode, and the organic light-emitting diode comprises an anode, a cathode, an organic layer, and a polarizer;
the second imaging structure is a liquid crystal structure, and the liquid crystal structure comprises a pixel electrode, a first orientation layer, a liquid crystal layer, a second orientation layer, and conductive glass that are respectively and sequentially stacked from bottom to top;
the first drive signal is a current signal, and the second drive signal is a voltage signal;
the anode and the cathode are configured to mutually cooperate to apply the first drive signal to the organic layer to output light with intensity corresponding to strength of the first drive signal, to perform amplitude modulation on light used when displaying the first image and the second image; and the polarizer is configured to restrict a polarization direction of light output from the organic layer; and
the pixel electrode and the conductive glass are configured to: mutually cooperate to apply the second drive signal to the liquid crystal layer, and control a deflection angle of a liquid crystal at the liquid crystal layer with the cooperation of the first orientation layer and the second orientation layer, to perform phase modulation on the light output from the organic light-emitting diode.

14. The imaging device according to claim 13, wherein an included angle between a direction of a fast axis or a slow axis of the liquid crystal layer and a transmission direction of the polarizer is 45°.

15. The imaging device according to claim 13, further comprising:
a first correspondence between the first drive signal and luminous intensity of a pixel of the organic light-emitting diode; and
a second correspondence between the second drive signal and the deflection angle of the liquid crystal at the liquid crystal layer,
wherein the first drive signal is determined based on the luminous intensity of the pixel of the organic light-emitting diode and the first correspondence, and the second drive signal is determined based on the deflection angle of the liquid crystal at the liquid crystal layer and the second correspondence.

16. The imaging device according to claim 15, wherein the luminous intensity of the pixel of the organic light-emitting diode is determined according to Formula (5), and the deflection angle of the liquid crystal at the liquid crystal layer is determined according to Formula (6):

$$I_{1ij} = I_{sij} + I_{pij} \qquad (5)$$

$$\cos\theta_{2ij} = \frac{I_{sij} - I_{pij}}{I_{sij} + I_{pij}} \qquad (6)$$

wherein in the formulas, i and j represent a pixel unit in a row i and a column j; $I_{1ij}$ represents luminous intensity of a pixel of a pixel unit in a row i and a column j of the organic light-emitting diode; cos $\theta_{2ij}$ represents a deflection phase of a liquid crystal, corresponding to a pixel unit in a row i and a column j, at the liquid crystal layer; $I_{sij}$ represents light intensity in a row i and a column j in the first image; and $I_{pij}$ represents light intensity in a row i and a column j in the second image.

17. The imaging device according to claim 1, wherein the imaging device further comprises a first controller configured to receive a voltage signal sent by a second controller, wherein the voltage signal carries the pixel information of the first image and the pixel information of the second image; and the first controller converts the voltage signal into the first drive signal and the second drive signal.

18. The imaging device according to claim 1, wherein the two polarization components comprising: light in a p-polarization state and light in an s-polarization state, wherein the light in the p-polarization state used when forming the first image, and the light in the s-polarization state used when forming the second image.

19. A display apparatus, comprising a polarization beam splitter and an imaging device comprising: a first imaging structure and a second imaging structure that are respectively and sequentially stacked from bottom to top, wherein
the first imaging structure is configured to: perform amplitude modulation on a light signal based on a first drive signal, and output amplitude-modulated light, wherein the amplitude-modulated light carries pixel information of a first image and pixel information of a second image, and the first drive signal is determined based on light intensity of the first image and light intensity of the second image; and
the second imaging structure is configured to perform phase modulation on the amplitude-modulated light based on a second drive signal, wherein phase-modulated light is decomposed into light having two polarization components, wherein the light having the two polarization components is respectively used when forming the first image and the second image, and the second drive signal is determined based on the light intensity of the first image and the light intensity of the second image;
wherein the polarization beam splitter is configured to decompose emergent light of the imaging device into light in a p-polarization state and light in an s-polarization state, wherein the light in the p-polarization state used when forming the first image, and the light in the s-polarization state used when forming the second image.

20. The display apparatus according to claim 19, wherein the first imaging structure is a first liquid crystal structure, and the first liquid crystal structure comprises a first pixel electrode, a first orientation layer, a first liquid crystal layer, a second orientation layer, first conductive glass, and a first polarizer that are respectively and sequentially stacked from bottom to top;

the second imaging structure is a second liquid crystal structure, and the second liquid crystal structure comprises a second pixel electrode, a third orientation layer, a second liquid crystal layer, a fourth orientation layer, and second conductive glass that are respectively and sequentially stacked from bottom to top;

the first drive signal and the second drive signal are voltage signals;

the first pixel electrode and the first conductive glass are configured to: mutually cooperate to apply the first drive signal to the first liquid crystal layer, and control a deflection angle of a liquid crystal at the first liquid crystal layer with the cooperation of the first orientation layer and the second orientation layer, wherein light passing through liquid crystals with different deflection angles has different polarization directions; and the first polarizer is configured to attenuate, to different degrees, intensity of light that passes through the first liquid crystal layer and that has different polarization directions, to perform amplitude modulation on incident light that is used when displaying the first image and the second image; and the second pixel electrode and the second conductive glass are configured to: mutually cooperate to apply the second drive signal to the second liquid crystal layer, and control a deflection angle of a liquid crystal at the second liquid crystal layer with the cooperation of the third orientation layer and the fourth orientation layer, to perform phase modulation on light output from the first liquid crystal structure.

\* \* \* \* \*